US006940267B1

(12) United States Patent
Swain

(10) Patent No.: US 6,940,267 B1
(45) Date of Patent: Sep. 6, 2005

(54) ERROR CORRECTION BY SELECTIVE MODULATION

(76) Inventor: William H. Swain, 4662 Gleason Ave., Sarasota, FL (US) 34242

( * ) Notice: Subject to any disclaimer, the term of this patent is extended or adjusted under 35 U.S.C. 154(b) by 0 days.

(21) Appl. No.: 08/579,395

(22) Filed: Dec. 27, 1995

(51) Int. Cl.[7] .......................... G01R 1/20; G01R 33/00; H01F 7/06

(52) U.S. Cl. .................. 324/127; 29/602.1; 324/117 H; 324/117 R; 702/191

(58) Field of Search ............................ 324/127, 117 H, 324/117 R, 130, 132, 613, 614; 702/17, 189–195; 29/602.1, 603.23, 825; 323/328, 329; 307/414; 330/8

(56) References Cited

U.S. PATENT DOCUMENTS

| | | | | | |
|---|---|---|---|---|---|
| 1,797,268 | A | * | 3/1931 | Lee | 246/34 D |
| 2,085,440 | A | * | 6/1937 | Moser et al. | 323/329 |
| 2,218,711 | A | * | 10/1940 | Hubbard | 323/330 |
| 2,227,468 | A | * | 1/1941 | Sweeny | 318/734 |
| 3,768,011 | A | * | 10/1973 | Swain | 324/117 R |
| 3,784,915 | A | * | 1/1974 | Oswald et al. | 702/195 |
| 4,008,439 | A | * | 2/1977 | Schroeder | 702/191 |
| 4,387,438 | A | * | 6/1983 | Lucich et al. | 702/195 |
| 5,007,007 | A | * | 4/1991 | van Zanten et al. | 702/191 |
| 5,555,530 | A | * | 9/1996 | Meehan | 702/17 |

* cited by examiner

*Primary Examiner*—Ernest Karlsen

(57) ABSTRACT

The accuracy of certain sensors is greatly improved by improving their signal to noise ratio (SNR) in the presence of an interfering noise. Sensors were discovered which have a SNR which substantially changes when an operating parameter is selectively modulated to different magnitudes. Some noise can be practically eliminated. In the simplest form, the sensor is operated where it is both stable and close to its best SNR This is usually faster and less costly, but the noise is never completely eliminated.

Often, the method involves operating the sensor in first one state and then another wherein the operating parameter has conditions where the sensor is stable, reproducible, and reliable, and wherein the SNRs are substantially different. The output of a state is combined with the output of another state in such a way that the noise cancels but a signal remains. Often the output in a state having greater noise is attenuated until it matches the noise content of another state having less noise. Then these outputs are subtracted. The difference is the more accurate error corrected output. In the ideal case, the difference has no noise output because the noise in the output from one state canceled the noise in the output of the other state.

However there is good signal in the difference, typically half as large as before subtraction, because the SNR in one state is preferably about double that in another state.

Unless two sensors or a combination are used, both signal and noise are constrained or conditioned to be practically constant over the time required to cycle from one state to the other and back. This is no hardship in many cases.

When it is not practical to complete a full cycle while both signal and noise are made to appear constant it may be necessary to take the difference between the outputs of two similar sensors operating simultaneously and continuously, but at differing effective magnitude of operating parameter so that their SNRs are substantially different. Or to build one sensor with two sectors with considerably different SNRs.

This invention has first been applied to Swain Meter® type clamp-on DC ammeters. Some results are good—the benefit in SNR is between 2 and 20, generally more like 10 times. It has also been found that at least one Hall type clamp-on DC ammeter has the essential characteristic of two substantially different SNRs at differing magnitudes of an operating parameter. We expect that better accuracy will be realized using this method.

®Swain Meter is a registered Trademark of the William H. Swain Co.

16 Claims, 12 Drawing Sheets

A simpler implementation of the method defined in Eq. i).

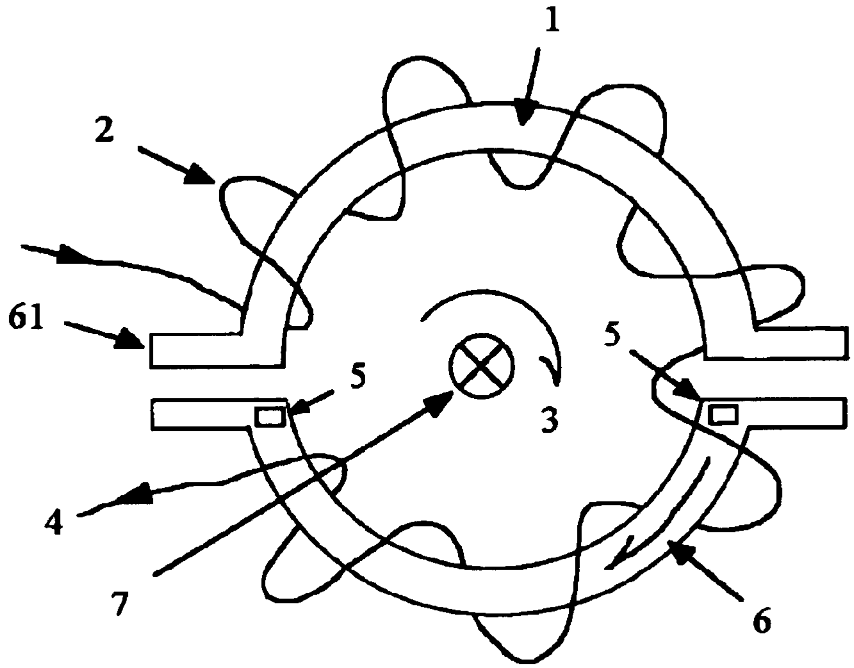
Fig. 1: A clamp-on sensor
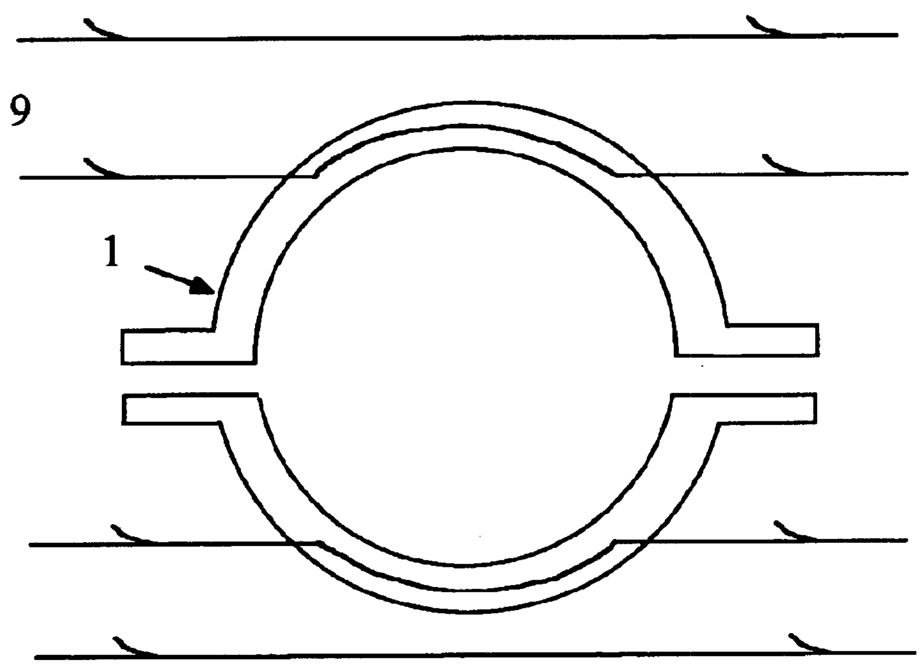
Fig. 2: Uniform magnetic field ($H_u$) 9 of the earth $H_e$ acting on the core.

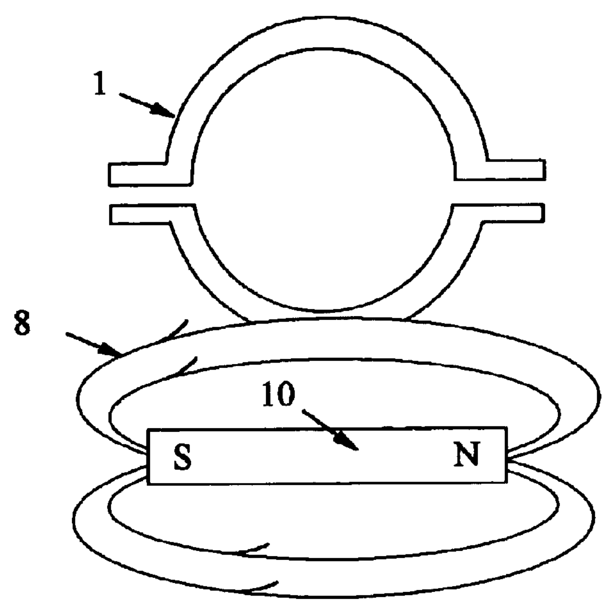
Fig. 3: A non-uniform magnetic field ($H_n$) 8 from a magnet acting on the core.

Normalized Signal Gain (g) vs. $I_{sm}$
and
Normalized Zero Offset from $H_n$ vs. $I_{sm}$
for
Five inch diameter aperture sensor #88.

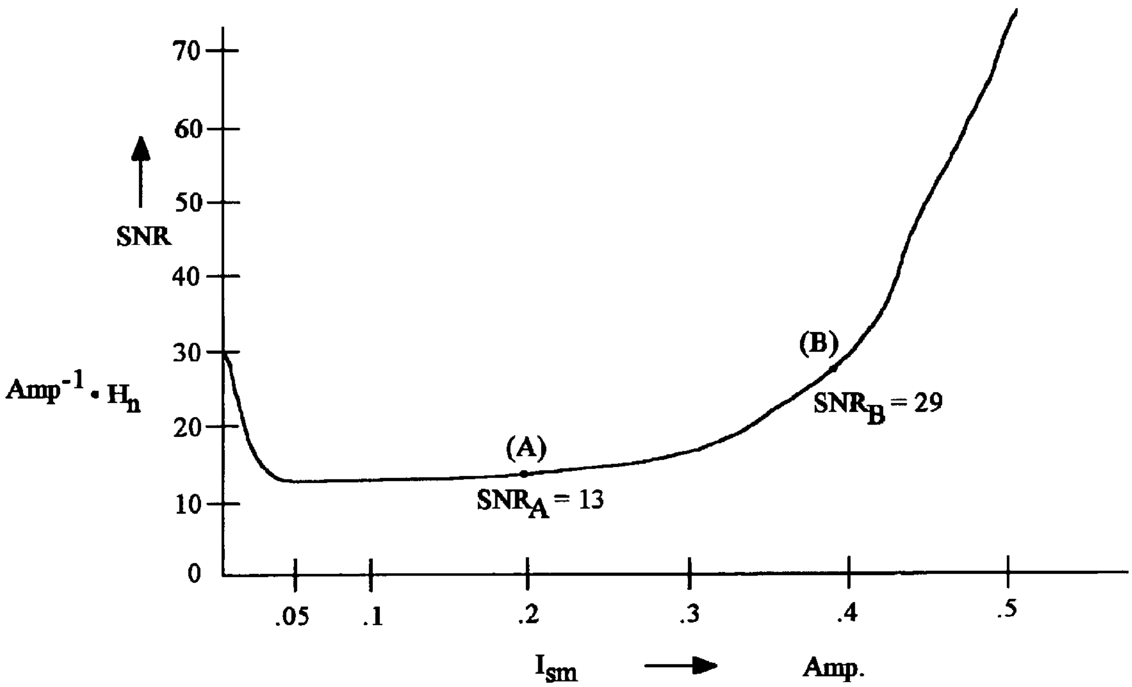

Figure 5
Signal to Noise Ratio (SNR) for Non-Uniform Field $H_n$
vs.
Operating Parameter $I_{sm}$
for
5" dia. aperture clip #88 in SN 2336 output → $\delta V$; input → $\delta I$ $$SNR \equiv \frac{\delta V / \delta I}{\delta V / \delta N} \Big\} \frac{\text{output}}{\text{noise}}$$

$$= \frac{\text{gain}}{\text{gain} \cdot \frac{\delta \acute{O}}{\delta N}} \leftarrow \frac{Z}{g} = \text{equivalent input offset I per unit non-uniform field } H_n$$

Normalized Signal Gain vs. Operating Parameter Magnitude
and
Normalized Sensitivity to $H_n$ vs. Operating Parameter Magnitude
for
A Hypothetical Sensor Presented as an Illustration.

The illustration displays typical relationships between error, gain, etc., before correction of a hypothetical sensor.

<u>Variables</u>:

I = 1

N = 3

Signal to Noise Ratio (SNR)
vs.
Operating Parameter Q
for
A Hypothetical Sensor shown in Fig. 6

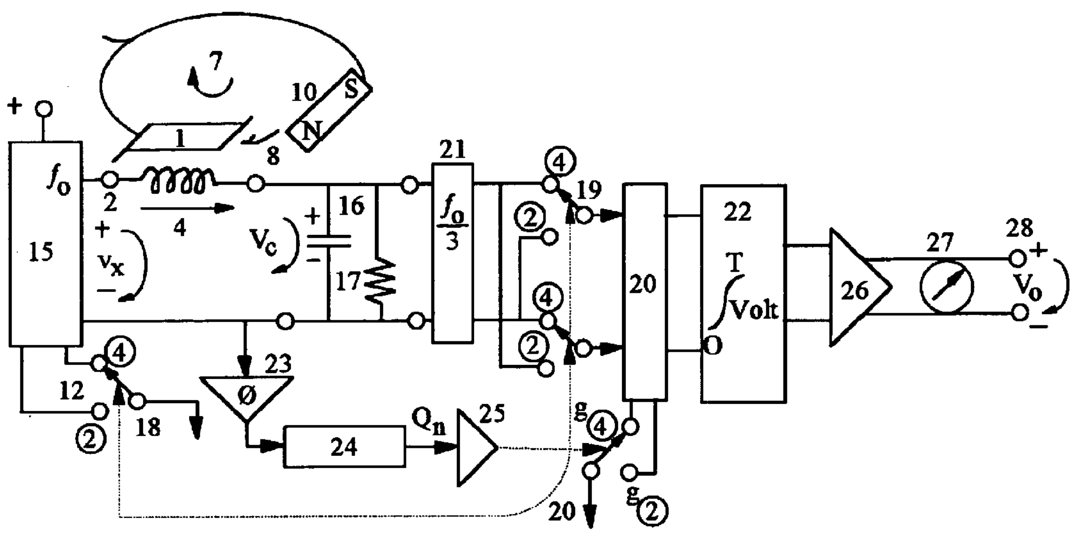
Fig. 9: A switching implementation of the mathematical relationship shown in Eq. i).

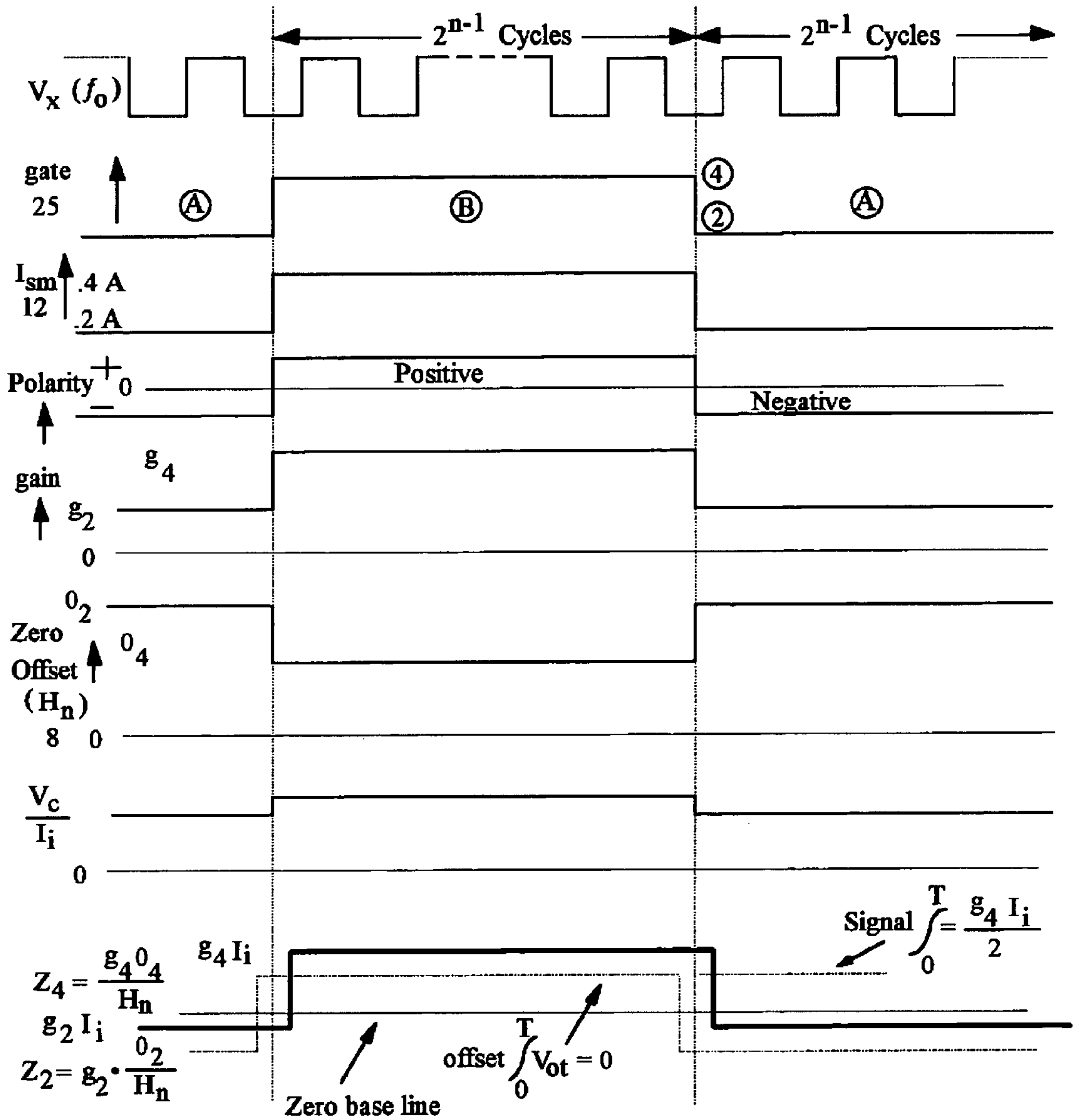
Fig. 10: Voltages in Fig. 9 shown as they change from time interval Ⓐ to time interval Ⓑ

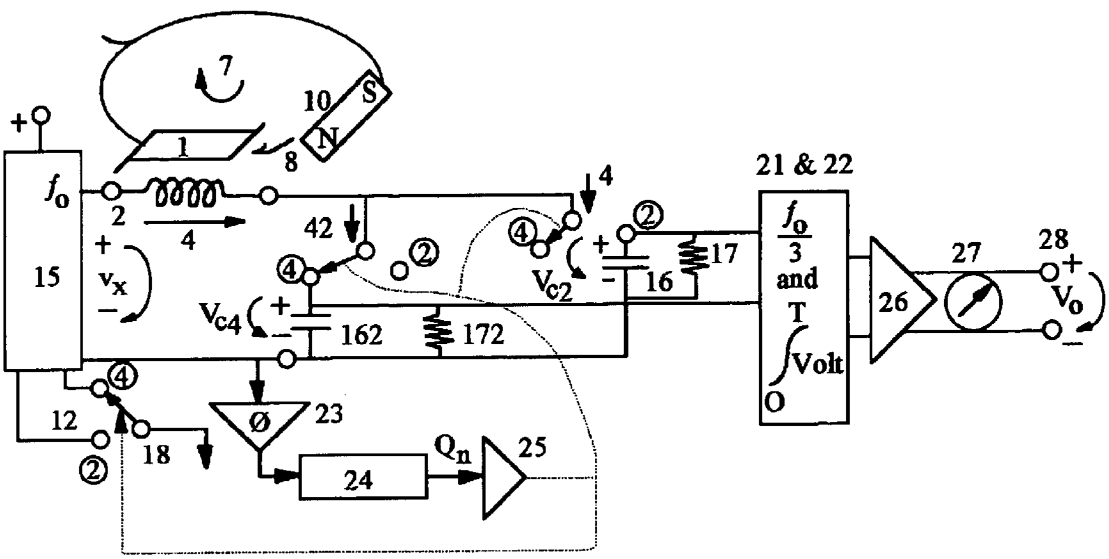
Fig. 11: A simpler implementation of the method defined in Eq. i).

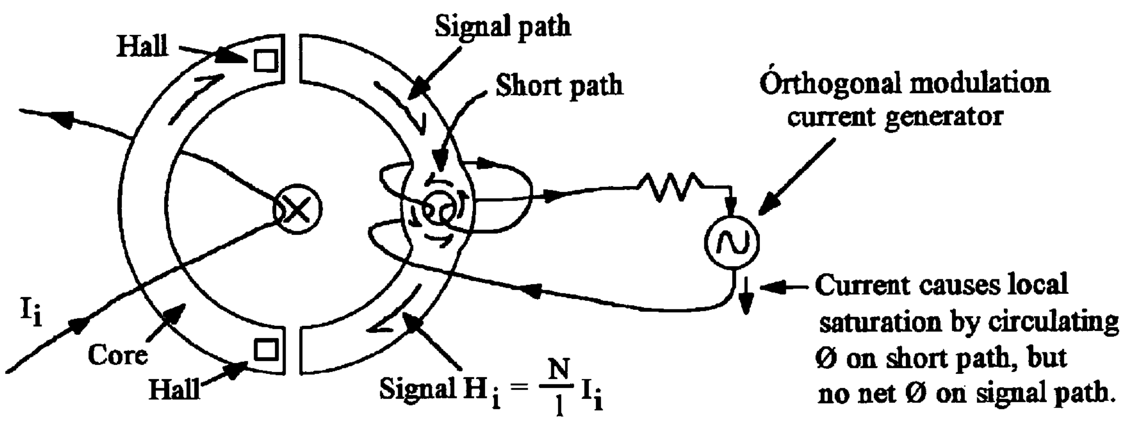
Fig. 12: Proposed core structure and magnetic reluctance selective modulation means for a Hall type clamp-on DC ammeter.

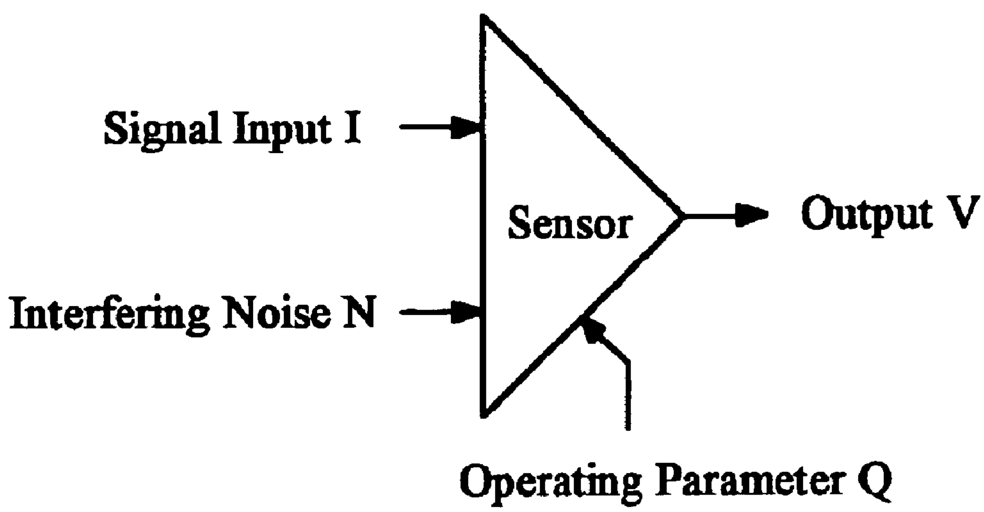
Fig. 13. General representation of a Sensor described in Eq. a) thru Eq. j).

ERROR CORRECTION BY SELECTIVE MODULATION

REFERENCE

U.S. Pat. No. 3,768,011 granted to William H. Swain

SUMMARY

This invention relates to sensors and/or implements for measurement or control.

The object of the invention is to improve accuracy by reducing error in the sensors output when in the presence of an interfering noise source.

The method used is usually to find or construct a sensor which has a signal to noise ratio SNR which changes a lot when its operating parameter is selectively modulated. The output of the lower noise sensor is combined with the output of the higher noise sensor so that, in the ideal case, the noise cancels, but a good signal remains. The easier way may be to take part of the output of the higher noise sensor and subtract it from the output of the lower noise sensor. Two sensors can be used, or the operating parameter of one sensor can be modulated (driven) from a higher to lower noise state.

If there is one sensor, the operating cycle time is generally reduced to less than the time during which the signal and noise can be constrained to be constant. However, if two sensors or a combination are used, there is little need to keep signal and noise constant.

In a simpler form, SNR is substantially improved by operating at a more favorable operating parameter magnitude. Noise is not canceled, but this form can be faster and cost less.

Sensors with implements using this invention have better accuracy because the SNR is generally improved by 2 to 20 times—typically ten times. This benefit is typical of Swain type clamp-on DC ammeters subject to interfering noise from non-uniform magnetic fields.

DRAWINGS

In the drawings:

FIG. 1 is a functional diagram of a sensor with a split magnetic core SQ surrounding a conductor carrying a current I to be measured. The core will have a coupling sense winding $N_s$ if it is to be used as a Swain Meter, or alternatively if it is to be used as a Hall type sensor, one or more Hall devices will replace the winding.

FIG. 2 illustrates interference from the uniform magnetic field $H_u$ due to a very remote and large field such as that of the earth, $H_e$.

FIG. 3 illustrates interference from the non-uniform magnetic field $H_n$ due to a magnet near the sensor.

FIG. 5 is a graph illustrating the essential characteristic in terms of signal to noise ratio SNR for 5" diameter aperture clip #88.

FIG. 9 is a functional diagram of a switching implementation of the method as stated in a mathematical relationship.

FIG. 10 portrays voltages in FIG. 9 as they change from time interval to Ⓐ time interval Ⓑ.

FIG. 11 is a functional diagram of a simpler implementation of the method.

FIG. 12 illustrates a proposed core structure and selective modulation means for a Hall type clamp-on DC ammeter.

FIG. 13 is a general representation of a sensor described in Eq. a) thru Eq. j).

DESCRIPTION OF THE INVENTION

Error Correction by Selective Modulation

General

This invention can be applied to improve the accuracy of sensors of many and diverse types for measurement and control. It has been applied to reduce the zero offset error of clamp-on DC ammeters, and especially to Swain Meters®.

Purpose

Interference type noise causes an error in the output of some sensors. The purpose of the present invention is to improve the accuracy by improving the signal to noise ratio (SNR) of sensors and associated implements for measurement or control. A sensor and/or implement may also be called a transducer or signal translator. A particular purpose is to improve the accuracy of sensors for clamp-on or non-contact DC ammeters, both of the Swain Meter® and Hall type, by correcting error due to zero offset caused by interference from non-uniform magnetic fields due to local magnets, and also by uniform fields due to more remote magnets such as the earth.

Method and Means

It was discovered that certain sensors have a sensitivity to an interfering noise which changes a great deal more than the sensitivity to a signal input when the magnitude of an operating parameter is changed. We call this selective modulation. The noise can be due to a change in the strength of a magnetic field, heat or cold, pressure of a fluid, etc.

A method of improving accuracy is to divide down the sensors output when it is in a high noise state, retain and later subtract this from the sensors output when it is in a low noise state so that the noise largely cancels, but a good signal remains. This may be the simplest process for combining sensor outputs. A process for doing this is given in a general mathematical relation, and in more specific forms derived therefrom. The means for doing this are called implements, or sensor with implement. They may also be called transducers or signal transducers Outline of Contents The remainder of this specification includes the following sections:

The Introduction begins with the Swain Meter® Patent of William H. Swain, U.S. Pat. No. 3,768,011. FIGS. 1, 2, and 3 show a basic clamp for a non-contact DC ammeter of either the Swain type (with coil $N_s$ (2)), or the Hall type with a Hall device (5); and they show the effects of interfering magnetic noise $H_n$ (8) and $H_u$ (9).

Figure 4:
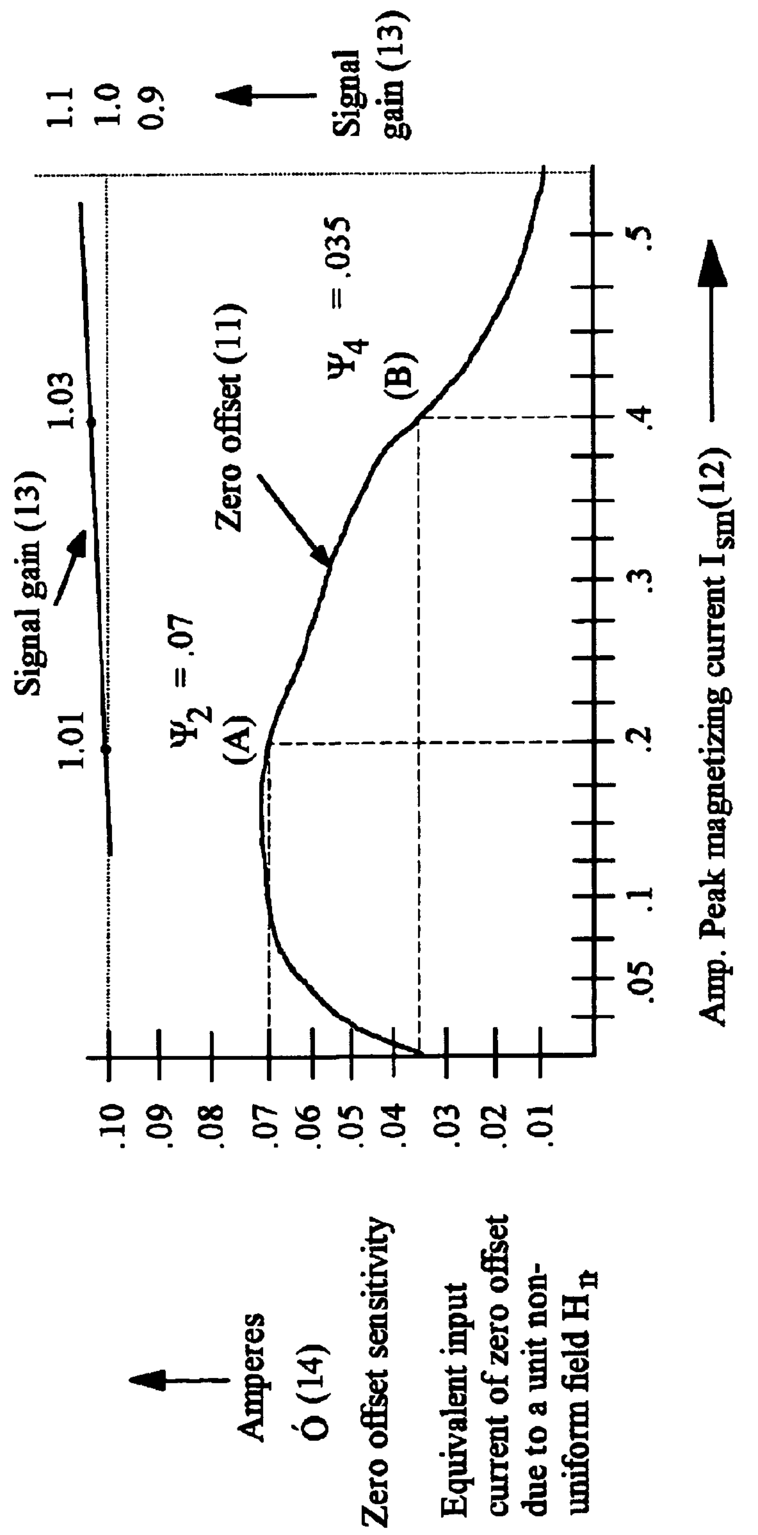
FIG. 4 is a graph illustrating the essential characteristic discovered in a type of clamp used in some Swain Meters. As the operating parameter $I_{sm}$ increases, the signal gain increases only slightly, but the normalized output zero offset due to noise, here called Ó, first increases and then decreases to half and less.

The Discovery that many Swain sensors had a zero offset Z error heavily dependent on the magnitude of operating parameter $I_{sm}$, but stable gain g for the input signal I is shown in FIG. 4. Normalized output error Ó and noise sensitivity Ψ are introduced, along with signal to noise ration SNR This is plotted in FIG. 5. Both FIG. 4 and FIG.

5 illustrate the Essential Characteristic needed in a sensor for successful noise correction by selective modulation. We have also seen these in a Hall type clamp-on DC ammeter.

The General Method and Mathematical Relationship section considers the theory and uses FIGS. 6, 7, and 8 to describe a hypothetical and generalized sensor later used to illustrate an application of the theory. The sensor's output V has a sensitivity to an input I, called gain g. The sensor also is sensitive to a noise N, and this is called Ψ. The inverse of Ψ is the SNR. All are defined and inter-related.

Figure 6:
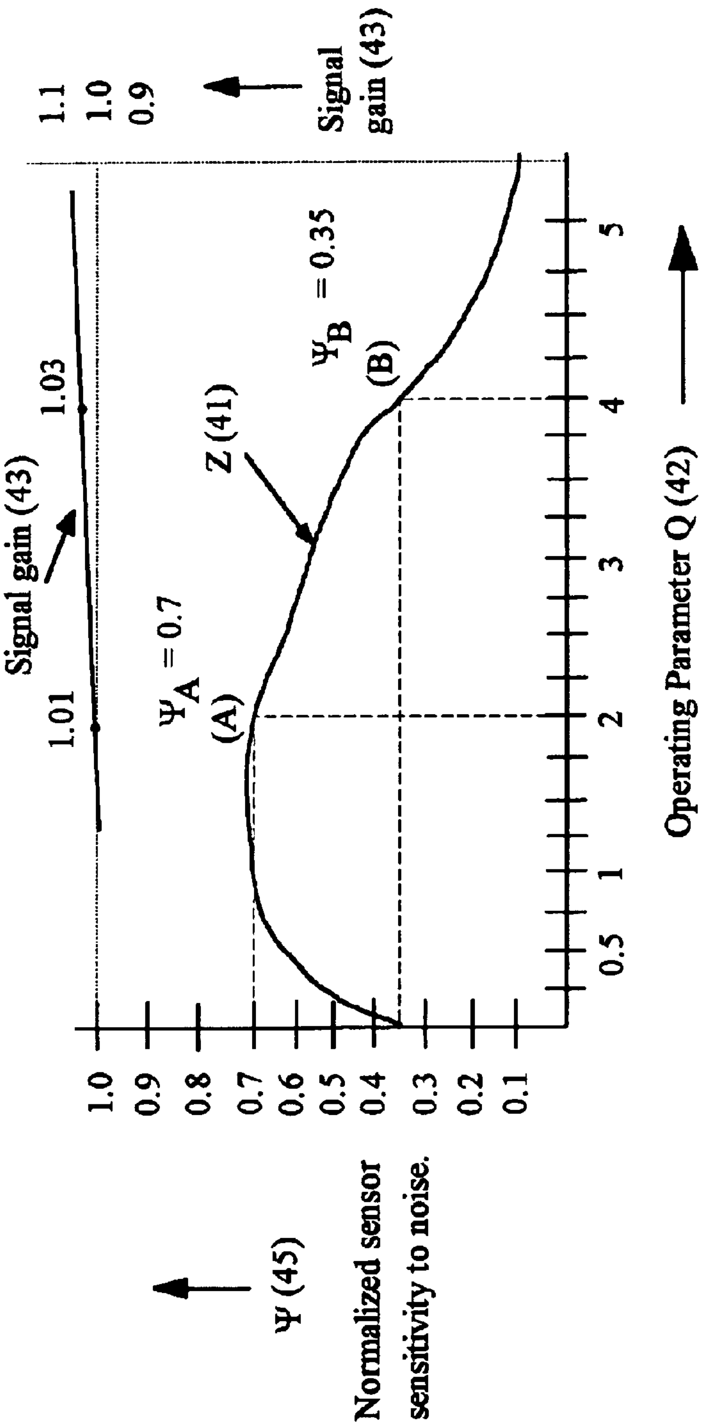
FIG. 6 is a graph of normalized sensor sensitivity to noise Ψ and normalized gain g vs. an operating parameter Q for a hypothetical sensor presented as an illustration
Figure 7:
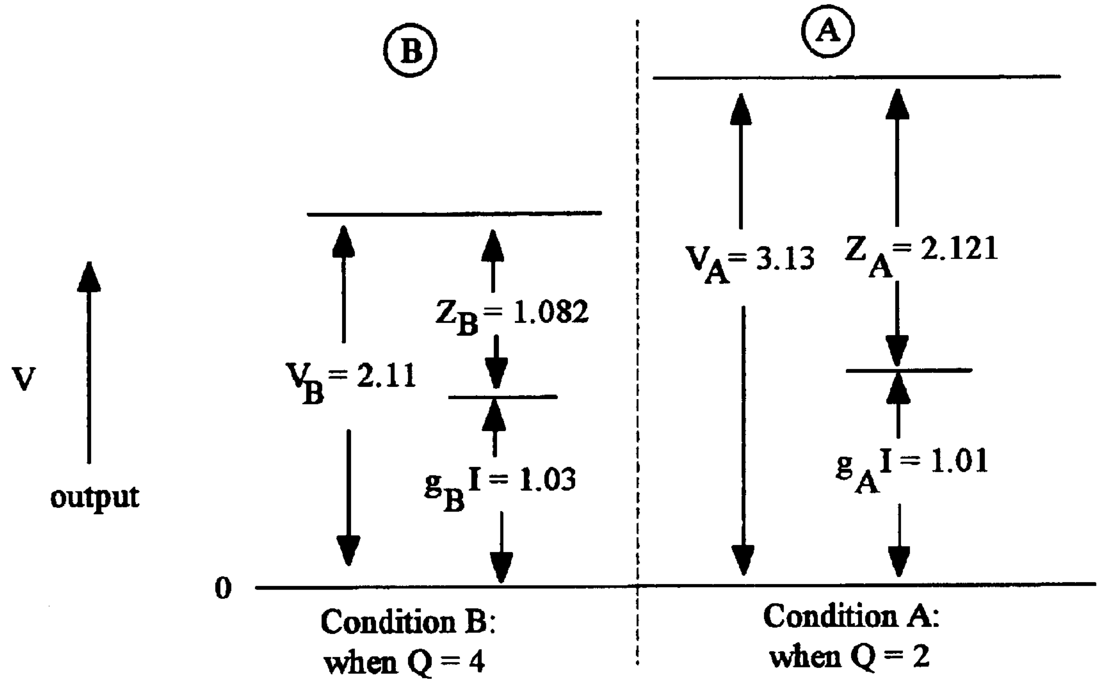
FIG 7 is a bar graph showing typical relationships between error, gain, etc., before correction of a hypothetical sensor.
Figure 8:
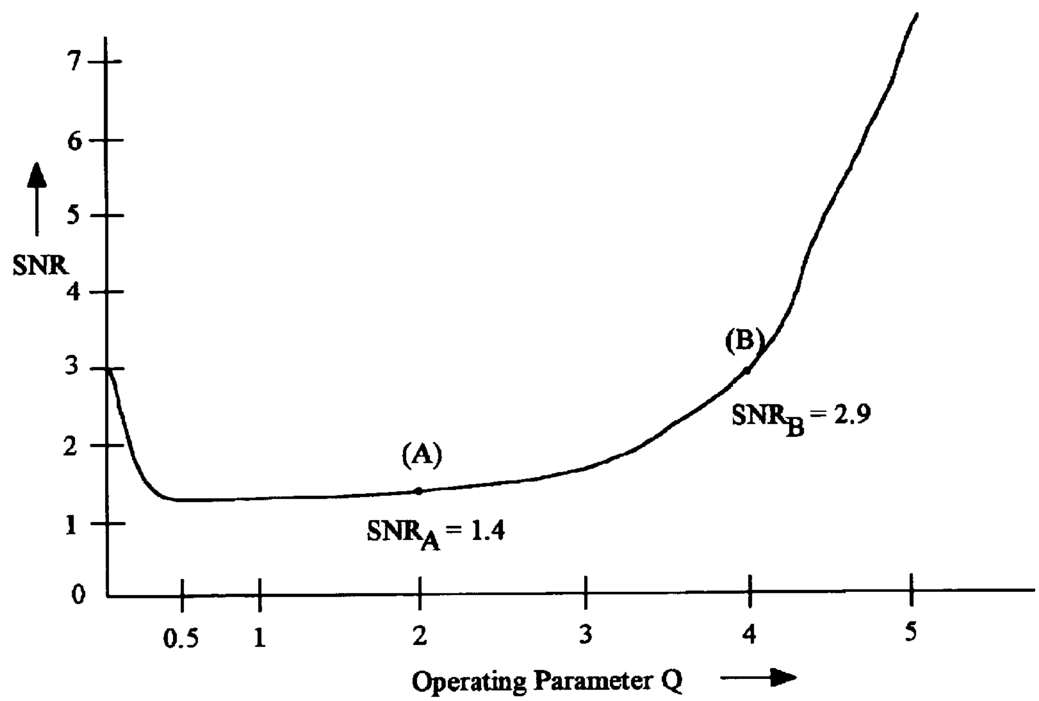
FIG 8 is a graph illustrating a change in signal to noise ratio SNR vs. an operating parameter Q for a hypothetical sensor.

The General Method Applied to a Hypothetical Senor section details a method or process for applying the general method to the specific hypothetical sensor characterized in FIGS. 6, 7, and 8. The outputs of state Ⓐ and state Ⓑ are combined in a way which cancels noise but preserves signal. In one way of doing this, the output of high noise state Ⓐ is attenuated and then subtracted from the output of low noise state Ⓑ. The result is the noise cancels, but a good part of the input signal I is amplified and available at the error corrected output $V_c$. The $SNR_c$ of $V_c$ is much better. The benefit of the process may be ten to one. A combining process is generalized further to Eq. i) which spells out a process in fill detail, supplemented by Eq. j) for specifying the divisor factor η in terms of the measured characteristic of the sensor as the operating parameter Q is driven to different magnitudes.

The Specific Method and Mathematical Relationships for Swain Meter type Sensor section starts with the calibration or measured characteristics (showing a good essential characteristic) of 5" Swain clip #88. These are shown in Table I, based on data from FIGS. 4 and 5. Then Eq. i) is repeated, defined for this application, and values inserted to get the expected noise cancellation residue, and gain for signal input. The benefit of using this particular combining process is calculated and shown in Table II to be estimated at 1800 to one.

A LEM model PR-20 Hall type clip-on DC ammeter was calibrated in two ways. The air gap (type G) characteristics are presented late in Table IV, which discusses practical details of magnetic reluctance modulation. The key calibration data, plus showing a strong essential characteristic item (β=0.33), and more, are organized and presented in Table V. This begins the son Specific Method and Mathematical Relationship for Hall type Sensors G. Eq. i) is repeated, and the calibrated characteristics are inserted numerically to demonstrate use of the method to design error correction by selective modulation. The benefit of using this process is 22 or 7 to one, and better if the divisor factor η is adjusted to fully cancel at least one type of noise interference.

The second calibration used an orthogonal magnetic field to increase the magnetic reluctance of the core. The calibration is summarized and presented later in Table III. FIG. 12 shows a more practical way to drive the operating parameter called magnetic reluctance of the overall core from a low reluctance to a high reluctance state by local core saturation on a short path.

The section Specific Method and Mathematical Relationship for Hall type Sensor Ó presents the key calibration results plus showing an essential characteristic item (β=0.013) which seems extreme. None-the-less, the general method can be, and is, applied. The predicted benefit is 214 to one.

Two practical designs are presented to illustrate use of the method to construct and use an instrument embodying the invention.

Non-contact Ammeter Implementation for Swain Meter

This section shows the first practical design embodying the invention as shown in FIG. 9. This switching implementation worked using clip #88 (characterized in FIG. 4 and FIG. 5). Details are discussed and a timing graph is shown in FIG. 10.

The Construction and Results section gives some detail on the construction of 5" clip #88 and its operation in both FIG. 10 and also in the preferred implementation of FIG. 11. A benefit of at least five to one was measured.

A Simpler Implementation of Eq. i) is shown in FIG. 11, and its details of construction and operation are given with 5" clip sensor #88.

Hall Devices

The Introduction gives sources and objectives.

First Calibration discusses the calibration data in Table III which characterizes this particular Hall type clamp-on DC ammeter when the modulated or driven operating parameter is a very strong orthogonal magnetic field which is thought to alter the reluctance of the core. Results obtained by applying the method are given earlier in Table VI.

A Reluctance Modulator proposal in shown in FIG. 12. This is thought to be more stable and reproducible than the orthogonal field or air gap methods.

A Second Calibration is summarized in Table IV. Results of application of this Hall type calibration are given earlier in Table V.

Conclusion is that the method can be widely applied to considerably improve accuracy.

Introduction

Swain Meter type clamp-on DC ammeters have gained wide acceptance because they are generally sensitive and accurate and available in a variety of forms for measuring 10 ma. to 500 Amp. direct current with sensors from ¼" to 5 feet in diameter. A clamp-on type sensor is shown in FIG. 1 herein.

A sensor plus implement combination can be constructed using the concepts of U.S. Pat. No. 3,768,011 to serve as a non-contact ammeter. In FIG. 2 therein, resistor $R_s$ can be made quite small—100 ohms or less, and capacitor C quite large—1000 micro farad or more.* The output voltage $V_c$ across capacitor C and resistor $R_s$ will henceforth be written simply as V, and in some places, assumes a more general meaning. More gain is assumed to be available if needed.**

* In some designs we have replaced $R_s$ and C with the low impedance input of a high current capability operational amplifier. This can be a lot faster, and it also converts the average current $I_s$ in the sense winding $N_s$ to an output voltage.

Here we assume that where gain is needed, it is available. The voltage across resister $R_s$ in FIG. 2** of the Patent may be only a few millivolts. The means for boosting this to a volt, essentially free of added error, are widely known.

The output voltage V is sensitive to an input signal current I, and also to an interfering noise N which causes an output zero offset Z. FIG. 13 represents a sensor with functional symbols An equation can be written to relate these:

$$V=gI+Z$$

Accuracy is dependent on g—this may be 1.000 V per Amp on a particular range*—and on Z. The values of g and Z should be constant over all values of input signal I, and also over all values of noise interference N.

* In some designs we have replaced $R_s$ and C with the low impedance input of a high current capability operational amplifier. This can be a lot faster, and it also converts the average current $I_s$ in the sense winding $N_s$ to an output voltage.

We have got 1% type control over the gain g, and also good control over zero offset Z due to the magnetic field of the earth $H_e$. On a ¼" clip this can be as low as 0±1 ma. peak equivalent input current Ó in response to a full vertical north-south spin in the earth's field $H_e$. We call the earth field uniform, $H_u$ as shown in FIG. 2 herein.

The most difficult type of interference noise N to control has been that due to a strong non-uniform magnetic field $H_n$ such as that shown in FIG. 3. A stray magnet, perhaps in a weld in a pipe, a sector of magnetized sheet metal in an automobile near the battery cable, or a magnetized fastener near the sensor can produce a considerable zero offset error Z. When the clamp-on sensor is moved from nearby to really around the conductor carrying the current to be measured, the intensity and direction of the effective non-uniform field $H_n$ changes, and this changes the zero offset Z, and so reduces the accuracy of output V.

The method and means shown herein have greatly improved accuracy by reducing noise, not only from $H_n$, but also, to a lesser degree, from $H_u$.

FIG. 1 represents a clamp-on type of non-contact sensor having a low magnetic reluctance core 1 which is split at the lips 61. These have a large cross section area to provide low magnetic reluctance all around the magnetic core path.6* If it is for a Swain Meter, it will have a coupling sense winding 2. It may be called a signal translator or transducer because the input current 7 sets up an input field 3 which influences, i.e., upsets the magnetic state of the core 1 and thus causes an average current 4 to flow in coupling sense winding 2 when connected to a suitable inverter. An output voltage is available when this current 4 flows through a resistor 17 called $R_s$.

* This is not essential. We have made, for special applications, non-contact ammeters wherein the core is an open ended ⊔ shape, or even a flat bar. The coupling between the input current and the core is not as good as when there is a low reluctance path all around the input current, but signal input current positioned near the core still influences the core, i.e., alters the magnetic state of the core enough so that some measurements are practical. It is expected that the method of this invention will also reduce error in these.

In another form using one or more Hall devices, the Input current 7 sets up a magnetic field intensity 3 which is sort of circular, acting all around the input conductor carrying 7. This influences the core, i.e., it produces a component 6 of the flux density in the core which acts on the Hall type multipliers which replace winding 2. These may be called transducers or signal translators because they convert flux density into an output voltage when suitably supported with bias current, etc.

Stray magnetic fields such as those shown in FIG. 2 ($H_u$) and FIG. 3 ($H_n$) produce a zero offset error because all non-contact DC Ammeters measure the current 7 by measuring the magnetic field 3 or flux density 6 set up in the magnetic core material of the sensor by the input current 7. Some $H_u$ or $H_n$ gets into the core in FIG. 1 and produces a zero offset error Z.

The zero offset error Z tends to be less if the core is continuous, with no split. When the core is split at the lips 61, it is preferred that these have low magnetic reluctance, often by virtue of large surface area.

The input current 7 sets up an input field 3. It is largely uniform and constant and circular about the current carrying conductor 7. In FIG. 1, input field 3 and input flux path 6 go evenly all around the core of the clamp.

This is not true of a non-uniform field ($H_n$) 8 such as that due to a magnet 10 near the clamp, as shown in FIG. 3. This is also not true of a uniform field $H_u$ 9, which may be produced by the Earth's magnetic field ($H_e$). This is shown in FIG. 2.

It may be that selective modulation of the signal and noise is feasible because the signal $I_i$ acts circumferentially, but the noise $H_n$ and $H_u$ act partially in the core and part outside.

In Swain Meters the zero offset (Z) produced by the Earth ($H_e$) or another uniform field ($H_u$) has been reasonably well controlled and reduced to a magnitude low enough to measure direct current to within ±1 ma. when using a ¾" clip. Pat. No. 3,768,011 shows the concept of peak magnetizing current ($I_{sm}$) and uniform coupling sense winding ($N_s$) used to get such zero stability when the field is uniform (FIG. 2), and the core is small But these techniques still allow a substantial zero offset (Z) when the core is large (over 4"), or when the field is strong and non-uniform (FIG. 3). We especially want to correct this error. We also want to further reduce the error due to $H_u$.

DISCOVERY

The inventor discovered that the output V of many Swain Meter clamps was a lot less sensitive (½ to ⅓ in some sensors) to a change in the intensity of a non-uniform magnetic field $H_n$ when the magnitude of an operating parameter $I_{sm}$ was doubled or tripled. And the sensitivity (gain) to a change in signal input current I stayed constant to within a few percent.

Essential Characteristic

FIG. 4 shows the approximate sensitivities for a five inch diameter aperture clip #88. This is an illustration of a sensor having the essential characteristic:

Firstly, the signal gain g (13) sensitivity to signal input I (7) is constant within a few percent as an operating parameter $I_{sm}$ (12) changes from 0.18 A to 0.5 Amp peak; and Secondly, the zero offset (11) sensitivity to a unit change in intensity of a non-linear magnitude field $H_n$ (8) is reduced to well under half over the same range of $I_{sm}$ (12).

The equation relating these quantities is V=gI+Z.

Zero offset is given in terms of $\acute{O}$=Z/g, where the input current I equivalent to the zero offset Z is obtained by dividing the zero offset Z by the signal gain g. The result $\acute{O}$ (14) is plotted in FIG. 4.

The data in FIG. 4 shows the approximate behavior of 5" dia. aperture clip #88. It uses concepts shown in Pat. No. 3,768,011, especially in connection with FIG. 2 and FIG. 4 therein. Clip #88 is outlined in FIG. 1 herein. The primary parts are:

A core SQ (1) having five layers of 0.725" wide-4D low reluctance steel from Magnetics Inc. of Butler, Pa., The core is mounted on a support and arranged so that the magnetic reluctance around the fill magnetic path is minimized. Care should be used to avoid forcing or bending the steel because stresses and strain may produce a poorer core.

A uniform coupling sense winding $N_s$ (2) of about 1000 turns of #22 magnet wire. A symmetrical and balanced form is preferred. The winding resistance should be less than 5 ohms. Half inch lips (61) which are constructed to mate well so that the magnetic reluctance all around the core is minimized.

The essential characteristic for successful error correction by selective modulation shown in FIG. 4 for clip #88 plots—in effect—noise sensitivity Ψ times gain g against the operating parameter $I_{sm}$. This is from $$\Psi \equiv \frac{\acute{O}}{N},$$

where $\acute{O}$ is still the equivalent input current of a zero offset Z and N is a unit of noise, in this case, magnetic field $H_n$. These and other matters are discussed in more detail in the general method section. Eq. i) on page 42 states the general method.

Signal to noise ratio SNR is the reciprocal of noise sensitivity Ψ, i.e., $$SNR = \frac{1}{\Psi}$$

SNR is, in a way, easier to understand, and it can help in writing claims, partly because it is basic. This will be made more apparent in the Hall device discussion. FIG. 5 is an SNR plot of the same #88 clip over the same operating parameter $I_{sm}$ range of magnitudes as in FIG. 4. It shows SNR, which is the signal sensitivity (gain g) divided by the noise sensitivity (gΨ) changing from a minimum of about 13 at about 0.07 Amp $I_{sm}$ to over 50 as $I_{sm}$ approaches 0.5 Amp peak.

The essential characteristic necessary for good error correction by selective modulation can be measured and presented in several ways, but that shown in FIG. 5—the plot of SNR vs. Operating Parameter is now considered the most basic. A good characteristic such as that in FIG. 5 has a substantial change in SNR—two to one or more—over a practical range of the condition of the operating parameter. It is not necessary that the gain g be nearly constant. Good correction can be had when the gain g changes 40% as the operating parameter Q is driven from one condition to another.

The Swain Meter discovery shown in FIG. 4 prompted a study of other sensors to see if they also have the essential characteristic. It was found in a Hall type clamp-on DC ammeter manufactured by LEM HEME. Details of this work are given in a later section associated with Table V and Table VI. These two discoveries lead me to expect that the essential characteristic will also be found in sensors for force, flow rate, position, chemical concentration, etc. We expect to be able to improve their accuracy using selective modulation.

General Method and Mathematical Relationship

Since it appears likely that someone will find sensors and/or implements for measurement or control of diverse physical quantities such as position or chemical concentration we need a general method and/or procedure for determining if the sensor has the essential characteristic, and if so, how to use selective modulation to improve accuracy by canceling error. Statements of the general method follow. The most general is Eq. i), augmented by Eq. j).

A general method for correcting error in the output of a sensor caused by interference from a noise is presented with reference to FIGS. 6, 7, and 8. These represent a hypothetical sensor. They are presented to illustrate the analysis.

A sensor is represented as having an output V which changes in response to a signal input I, and the output also has an error Z due to interference from a noise N. FIG. 13 presents this with functional symbols. Restated:

$$V \equiv gI + Z, \qquad \text{Eq. a)}$$

where the gain g of the sensor is

Eq. b)

$$g \equiv \frac{\delta V}{\delta I}.$$

This is the sensitivity or gain of the sensors output V to a signal input I.

A partial derivative symbol δ is used to indicate that the gain g is the change in sensor output V divided by the change in sensor signal input I.

In Eq. a), if the input I is zero, the output V equals the error Z due to noise. Or if there is an input but it is held constant, then the change in output V in the presence of an interfering noise N is the same as the change in error Z due to this same noise N. Therefore, the gain g times the sensitivity of the sensor's output V to a noise N, is:

Eq. c)

$$\frac{\delta V}{\delta N} = \frac{\delta Z}{\delta N}$$

The importance of an error Z in the output is better shown in terms of an equivalent noise input Ó which will have the same effect on the output V as an input signal I. Since both Ó and I are to be thought of as inputs, the signal input sensitivity, i.e., the gain g applies to both. Therefore, we define Ó by:

$$Ó \equiv \frac{Z}{g};$$

so

Eq. d)

$$g = \frac{\delta Z}{\delta Ó}.$$

Since Eq. b) gives $$g = \frac{\delta V}{\delta I},$$

and Eq. c) gives δV =δZ, then $$\frac{\delta Z}{\delta Ó} = \frac{\delta V}{\delta I},$$

$$\frac{\delta Z}{\delta Ó} = \frac{\delta Z}{\delta I},$$

so $$\delta Ó = \delta I \qquad \text{Eq. e).}$$

Thus Ó has the effect of an input, i.e., Ó is the noise equivalent input of error Z, which is the result of interfering noise N.

The ratio of the noise equivalent input Ó to the interfering noise N which caused it is the noise sensitivity Ψ. This is defined:

Eq. f)

$$\Psi \equiv \frac{\delta Ó}{\delta N}.$$

We get a little more direct meaning of Ψ by noting that:

$$g = \frac{\delta Z}{\delta Ó},$$

so $$\delta Ó = \frac{\delta Z}{g}.$$

Also δZ =δV, so

Eq. g)

$$\Psi = \frac{\delta V / \delta N}{g}.$$

Thus we see that the sensor noise sensitivity Ψ is the change in sensor output V divided by the change in the interfering noise N, all divided by the sensor gain g whereby the change in sensor input I changes the sensor output V.

Put another way, Ψ is the sensitivity of the sensor's output V to an interfering noise N, all divided by the sensitivity of the sensor's output V to signal input 1, i.e., Ψ is the inverse of SNR. Restated:

$$\Psi = \frac{\delta V / \delta N}{\delta V / \delta I}$$

Since gain g is defined in Eq. b) as $$\frac{\delta V}{\delta I},$$

the above is just another way of writing Eq. g).

FIG. 6 is a graph showing the normalized essential characteristic of a hypothetical sensor, presented here to help illustrate the method. The signal to noise ratio (SNR) changes a lot when an operating parameter Q changes its condition.* By this I mean that the signal gain g (43) changes only a few percent when the operating parameter Q(42) changes enough to cause the noise sensitivity Ψ (45) to change by a factor of two or more, or vice versa.

* Operating parameter Q can be any of a variety of physical quantities able to change condition. It can be a chemical mixture proportion, electric current, fluid pressure, etc. The change in the condition of Q can be a magnitude, as in peak current $I_{sm}$ changing condition from 0.2 to 0.4 Amp. Or it can be a change in power supply voltage or source impedance, a change in frequency used in a modulator, a change in direction of an applied force, etc.

By SNR I mean the sensitivity of the sensor's output V to the signal I divided by that to noise interference Ψ.

In Eq. b) $\frac{\delta V}{\delta I} = g$, and

In Eq. g) $\frac{\delta V}{\delta N} = g\Psi$, $SNR = \frac{g}{g\Psi}$, or

Eq. 1) $SNR = \frac{1}{\Psi}$

FIG. 8 is a SNR graph of the normalized essential characteristic of this hypothetical sensor.

General Method Applied to a Hypothetical Sensor

To show how error correction is achieved by this method, apply the general method to the hypothetical sensor shown in FIGS. 6, 7, and 8.

Operating parameter Q can be thought of as an input to a modulator, or as the modulator itself Functionally, a change in Q causes a change in the SNR of the sensor.

Two points (A) and (B) are selected in FIG. 6 and FIG. 8. Conditions before error correction in these two states Ⓐ and Ⓑ, are shown in bar graph form in FIG. 7. The objective is to combine the two outputs $V_B$ and $V_A$ so that the noise error components $Z_B$ and $Z_A$ cancel but a good part of the input signal components $g_B$I and $g_A$I remain. One way to do this is by subtracting part of $V_A$ from $V_B$.

In high noise state Ⓐ the sensor output is marked $V_A$ because it pertains to the state Ⓐ wherein the magnitude or condition of the operating parameter Q is driven to 2 by a means constructed to drive Q from one magnitude to another. Similarly, the gain is $g_A$, and the component of sensor output due to signal input I is $g_A$I. The error due to interference from noise N is marked $Z_A$.

In both states the same value is used for input I and noise N because it is assumed that neither one changes appreciably over a time duration of a full operating cycle from low noise state Ⓑ to high noise state Ⓐ and back again.

For a simple implement, the time duration $T_{A+B}$ of a full operating cycle from state Ⓑ to state Ⓐ and back again will probably have to be less than the time duration $T_{NI}$ during which both noise N and signal input I are naturally quite constant. However, if the signal input I and/or the noise N must change in less time than $T_{A+B}$ it may be necessary to condition the signal and/or noise. Those skilled in the signal conditioning art will know several options, including averaging, sampling and holding a data packet for later use, and filtering to remove more rapid fluctuations.

In either event it may be that the simpler way of combining to remove error may be to use η to divide down the larger noise packet and the subtraction device to take the difference so that the corrected output $V_c$ is practically free of noise.

FIG. 6 shows a hypothetical sensor with signal gains: $g_B$=1.03, and $g_A$=1.01.

It also shows the sensitivity to noise in each state: $\Psi_B$=0.35, and $\Psi_A$=0.7.

The error Z due to noise N interference is obtained from the value of noise sensitivity.

Since $$\Psi = \frac{\delta V / \delta N}{g},$$

and δV=δZ, $$\delta Z = g\Psi(\delta N). \quad \text{Eq. h)}$$

Without the change, $$\text{becomes } Z = g\Psi N. \quad \text{Eq. h)}$$

The change in the condition of Q* can be large or small What is needed is that the change in Q be sufficient to cause a substantial change in the signal to noise ratio SNR of the sensor.

For simplicity, the magnitude of input I is set at unity, and that of the noise sensitivity is set at three. Then we can get numbers for the bars in FIG. 7 from the graph FIG. 6.

| | | |
|---|---|---|
| $g_B I = (1.03)(1)$<br>$= 1.03$ | $g_A I = (1.01)(1)$<br>$= 1.01$ | $\frac{\Psi_B}{\Psi_A} \equiv \beta = 0.50^{**}$ |
| $Z_B = g_B \Psi_B N$<br>$= (1.03)(0.35)(3)$<br>$= 1.0815$ | $Z_A = g_A \Psi_A N$<br>$= (1.01)(0.7)(3)$<br>$= 2.121$ | β = 0.5 is a good practical value in most cases. |

-continued

| | | |
|---|---|---|
| $V_B = 2.1115$ | $V_A = 3.131$<br>$0.51\ V_A = 1.60$ | $\frac{Z_B}{Z_A} = 0.51$ |

$$V_B - \left(\frac{Z_B}{Z_A}\right)V_A = 2.1115 - 1.60 = 0.512$$

* see footnote on p. 16

**Note that β is positive, and less than unity. The suffix B is assigned to the state having the least noise sensitivity Ψ, and suffix A to a state with a greater Ψ. This forces β to be less than unity by definition. If it is negative, the design should be reviewed for signs of instability.

To get error correction we want to cancel $Z_B$ with a part of $Z_A$.

$$\text{Since } \frac{Z_B}{Z_A} = \frac{g_B\Psi_B}{g_A\Psi_A} = \frac{1.082}{2.121} = 0.51$$

I find that this value ($Z_B/Z_A$=0.51) is practical.

To cancel $Z_B$ and thereby correct the error, we can multiply $Z_A$ by 0.51 and subtract the result from $Z_B$. But generally, $Z_A$ is not available alone, but it is combined with an input signal component in $V_A$. Therefore we multiply all of $V_A$ by $Z_B/Z_A$=0.51, and subtract the result from $V_B$. This is the corrected sensor output $V_c$. The error due to noise is canceled in the sensor's output. The available signal at the sensor output $V_c$ is 0.512, i.e., about half of $g_B$I. This works out well in practice.

** By "multiply" and "subtract", I mean multiply or divide; and add or subtract, depending on the ratio of SNRs and gains at differing conditions of the operating parameter Q. We combine as needed to cancel the noise and retain a signal by using the method of Eq. i) and Eq. j).

Sensor output $V_c$ is usable, and in the ideal case it is practically free of error due to interfering noise. Thus the signal to noise ratio (SNR) is very high, much better than the SNR=½ for state Ⓐ alone, or the SNR=1 for state Ⓑ alone.

Essential Characteristic

To determine whether or not a sensor has a strong essential characteristic, consider two extremes.

First, assume a very large change in SNR such as is shown later in Table VI. There $$\beta \equiv \frac{\Psi_B}{\Psi_A} = 0.13 \text{ and } \frac{g_B}{g_A} = \frac{100}{140}.$$

The product is $$\frac{Z_B}{Z_A} = \left(\frac{100}{140}\right)(0.13) = .0093.$$

This times $V_A$ easily cancels the noise in $V_B$. Also; 99% of $V_B$ is available as the noise free output. Therefore when the SNRs are very different, the essential characteristic is strong, and we have good prospects for fine error correction with most of the signal remaining.

On the other hand, assume the opposite—namely that $g_A$=$g_B$ and $$\beta = \frac{\Psi_B}{\Psi_A} = 0.95.$$

Then $$\frac{Z_B}{Z_A} = 0.95.$$

The signal to noise ratios (SNRs) are nearly the same. To cancel the noise in $V_B$ we need to use 95% of $V_B$. This also cancels out 95% of the signal in $V_B$, so the remaining signal is only 1/20 of that in the beginning. This is a questionable design. It may work, but it may not be too stable, and will need extra gain. Therefore, when the SNRs are nearly the same we question whether error correction by selective modulation is practical because the essential characteristic is weak. It may help to change the magnitude of the operating parameter Q in state Ⓐ and Ⓑ, or to change the design of the sensor to better match the change in Q.

Use of the general equation i) augmented by Eq. j) will soon show which sensor characteristics are good and which may lead to complications. For now, I am most confident with $g_A$ close to $g_B$, and β close to one half.

General Process

The preceding method or process for greatly improving the SNR at the output of a sensor is generalized below.

For convenience, we define the ratio of the lower noise sensitivity $\Psi_B$ to the greater noise sensitivity $\Psi_A$ as β, i.e., $$\text{Eq. k)}\quad \beta \equiv \frac{\Psi_B}{\Psi_A},$$

where $\Psi_B$ and $\Psi_A$ are measured or calibrated characteristics of the sensor at two magnitudes of the operating parameter Q. An example is shown in FIG. 6. Here β=0.5. This is usually a good practical value, indicating a good essential characteristic.

Also, we define the divisor factor η as the ratio of the products of the greater noise sensitivity $\Psi_A$ times the gain $g_A$ in the same state, i.e., at the same magnitude of the operating parameter Q, all divided by the lesser noise sensitivity $\Psi_B$ times the gain $g_B$. Thus $$\text{Eq. j)}\quad \eta \equiv \frac{\Psi_A g_A}{\Psi_B g_B}$$

Again the values result from a calibration of the sensor at the corresponding two levels of Q. An example shown in FIG. 6, wherein:

$$\eta = \frac{(.7)(1.01)}{(.35)(1.03)}$$

$$\eta = 1.96$$

This shows that the essential characteristic is good for error correction by selective modulation.

In the really general process, the signal input I and the interfering noise N are conditioned so that they appear to be constant during the combining process. To combine, the output in a state corresponding to a better SNR is mixed with the output in a state corresponding to a lesser SNR in proportions and polarity such that the noise N largely cancels at the error corrected output $V_c$, but good gain for the signal input I remains. For example:

$$g_c = \frac{\delta V_c}{\delta I} \geq \left(\frac{1}{3}\right)\frac{\delta V}{\delta I}$$

in the better of the above states.

In this particular general process, sensor error is canceled by subtracting from the sensor output in the low noise sensitivity state Ⓑ the result of dividing* the sensor output in the high noise sensitivity state Ⓐ by divisor factor η. Restated, the error corrected sensor output $V_c$ is:

* Note that $Z_B/Z_A$ above is $$\frac{1}{\eta}.$$

We could just as well multiply by $$\frac{1}{\eta}.$$

"Subtracting" and "dividing" really have the general meaning of combining. In some sensors $$\beta = \frac{\Psi B}{\Psi A}$$

may be near one, but $$\frac{G_A}{G_B}$$

may change a lot. What is needed is to follow the method of Eq. i) and Eq. j) so as to cancel noise and retain a signal.

$$V_c = V_B - \frac{V_A}{\eta}$$

$$V_c = g_B I + Z_B - \left(\frac{1}{\eta}\right)(g_A I + Z_A)$$

$$V_c = \left(g_B - \frac{g_A}{\eta}\right)I + \left(Z_B - \frac{ZA}{\eta}\right)$$

By Eq. h) $Z_B=g_B\Psi_BN$; and $Z_A=g_A\Psi_AN$. Then $$\text{Eq. i)}\quad V_c = \left(g_B - \frac{g_A}{\eta}\right)I + \left(g_B\Psi_B - \frac{g_A\Psi_A}{\eta}\right)N.$$

This is a more basic equation, i.e., a general method.

The second term is the error due to noise which we want to cancel Then the coefficient of noise N will be zero if:

$$g_B\Psi_B = \frac{g_A\Psi_A}{\eta}, \quad \text{or}$$

$$\frac{1}{\eta} = \frac{g_B}{g_A}\frac{\Psi_B}{\Psi_A},$$

and remembering that $$\frac{\Psi_B}{\Psi_A} \equiv \beta,$$

we have $$\frac{1}{\eta} = \frac{g_B}{g_A}\beta, \quad \text{or } \eta = \frac{g_A}{\beta g_B}. \qquad \text{Eq. j)}$$

So the requirement for noise N cancellation is that the sensor be designed so that the divisor factor η is set according to Eq. j), using measured or calibrated characteristics of the sensor as shown in FIG. 6.

Note that if $g_a \doteq g_B$;

$$\eta = \frac{1}{\beta};$$

or $\eta\beta \doteq 1$ is close to the error cancelation requirement.

Eq. i) can be rewritten using η from Eq. j) to null the noise as follows:

$$V_c = \left(g_B - \frac{g_A g_B}{g_A}\right)I + \left(g_B\Psi_B - \frac{g_A\Psi_A\beta g_B}{g_A}\right)N$$

$V_c=g_B(1-\delta)I+(g_B\Psi_B(1-1)N$. The noise term vanishes, so $$V_c=g_B(1-\delta)I. \qquad \text{Eq. k)}$$

If β is about ½, then the error corrected sensor output $V_c$ is $V_c=(g_B/2)I$. This is generally practical.

All considered, I now regard $\delta \doteq ½$; $\eta \doteq 2$ as an optimum design.

Specific Method and Mathematical Relationship for Swain Meter Type Sensor

A specific method for correcting error by selectively modulating a sensor for a Swain Meter is derived from the general method given in Eq. i) with reference to FIG. 6 and FIG. 8 which are for a hypothetical sensor. This leads to a more specific mathematical relationship.

Five inch diameter aperture sensor #88 was calibrated and the data is presented in FIG. 4 and FIG. 5. It is seen that the essential characteristic for error correction by selective modulation is present.

If it is elected to correct error by switching from one state to another as discussed in connection with the implementation of FIG. 9 or FIG. 11 the essential characteristic in FIG. 4 can be summarized in Table I.

State Ⓐ is the higher noise state because the zero offset Z is greater when a standard magnet is present. This is shown in Table I by $\Psi_2$ in state Ⓐ, which is double $\Psi_4$ in state Ⓑ. State Ⓑ is the low state noise.

TABLE I

| | State Ⓑ | State Ⓐ | Ratio |
|---|---|---|---|
| Point on graph | (B) | (A) | |
| $I_{sm}$ | 0.4 | 0.2 | |
| gain | $g_4$ = 1.03 | $g_2$ = 1.01 | Characteristics |
| Noise sensitivity | $\Psi_4$ = 0.035 | $\Psi_2$ = 0.07 | of 5" clip #88. |

TABLE I-continued

| | State (B) | State (A) | Ratio |
|---|---|---|---|
| $\beta = \frac{\Psi_4}{\Psi_2}$ | | | 0.5 |
| $\eta = \frac{\Psi_2 g_2}{\Psi_4 g_4}$ | | | 1.96* |

*Note that $\eta$ is close to $\frac{1}{\beta}$.

The general process for error correction is shown in Eq. i) on page 43. The results are shown in Table II.

$$V_c = \left(g_4 - \frac{g_2}{\eta}\right)I + \left(g_4\Psi_4 - \frac{g_2\Psi_2}{\eta}\right)N, \quad \text{Eq. i)}$$

where $V_c$ is the specific sensor output with error corrected, $g_2$ and $g_4$ are the specific sensor gains shown in FIG. 4, obtained by calibrating sensor #88 at two operating parameters, namely $I_{sm}$=0.2 and then $I_{sm}$=0.4, $\Psi_2$ and $\Psi_4$ are the specific sensor noise sensitivities shown in FIG. 4, obtained by calibrating sensor #88, $\eta$ is defined by Eq. j) on page 32, I is the sensors signal input current, N is the sensors noise N interference.

Eq. i) shows how noise is canceled. The noise term (2 d term) balances all the noise at point B at $I_{sm}$ level 0.4 against $1/\eta$ times that at point A at $I_{sm}$ level 0.2. When the two parts of the noise term are equal the noise cancels. Final adjustment is usual done experimentally.

The coefficient of noise N will be zero in the ideal case when $g_4\Psi_4 - g_2\Psi_2/\eta = 0$. Inserting the values in Table I we get (1.03)(0.035)−(1.01)(0.07)/1.96=0.00002, which is practically zero.

We find that a substantial part of the clips tested for the essential characteristic have a $\beta$ value between 0.35 and 0.65* at $I_{sm}$ values which are practical. One way to get good error correction is to simply use the clip with and without a noise magnet, and adjust the value of $\eta$ in the implement for best noise cancellation. In effect, the implement and sensor are used as an analog computer to solve Eq. j). Placing the standard noise magnet at a calibrated position near the clip, and then removing it, provides a repeatable noise signal for use while adjusting the value of $\eta$ for best noise cancellation from $V_c$.

*The value of $\beta$ changes with the orientation and strength of the magnetic field, and also with it's position relative to the sensor. For example, the value of $\beta$ due to a nose or tail lip field is generally somewhat different from that measured when the magnet is nearer a side of the sensor.

The useful corrected output in response to signal input I in Eq. i) is the first term:

$$V_c = \left(g_4 - \frac{g_2}{\eta}\right)I.$$

From Table I the coefficient is $$V_c = \left(1.03 - \frac{1.01}{1.96}\right)I,$$

$V_c$=0.515I.

This is half the gain which we would have if we operated all the time in state (B), and about half of fill time operation in state (A). It has proven practical This indicates that the essential characteristic is sufficient to greatly improve accuracy by error correction by selective modulation.

The corrected output of the sensor has a lot better SNR (in the ideal case). The benefit of using error correction is calculated in Table II.

TABLE II

| Operation in state (A) is compared with the corrected output of 5" ciip #88. (See above Eq. h) | |
|---|---|
| State (A) full time | Corrected |
| $V_2 = g_2I + Z_2$<br>$V_2 = g_2I + g_2O_2$<br>$V_2 = g_2I + g_2\Psi_2N$<br>$V_2 = 1.01I + (1.01)(.07)N$, so | $V_c = 0.515I + 0.00002\ N$<br><br>(Data from Table I.) |
| $\frac{\delta V_2}{\delta I} = 1.01\ \frac{\delta V_2}{\delta N} = .0707$, or | $\frac{\delta V_c}{\delta I} = .515\ \frac{\delta V_c}{\delta N} = .00002$ |
| $SNR = \frac{V_2/I}{V_2/N}$ | SNR = 25,750 |
| SNR = 14.3 | |

$$\text{Benefit} = \frac{\text{SNR Corrected}}{\text{SNR (A)}} = \frac{25{,}750}{14.3} = 1801 \text{ to one.}$$

This says that the design used for a specific sensor should start with the sensors calibration in Table I, i.e., list the measured characteristics of the sensor, and then incorporate a divisor factor $\eta$ calculated from Eq. j).

If the values of gain and noise sensitivity are not practical for correction, the builder will need to look for other values of $I_{sm}$ which give a better essential characteristic, or look for a more suitable sensor.

Specific Method and Mathematical Relationship for Hall Type Sensors G.

A specific method of correcting error by selectively modulating the air gap of a Hall type sensor for a LEM model PR-20 is derived from the general method given above, and with reference to Table IV which states the results of a two point calibration with an air gap. The data is organized below in Table V.

TABLE V

| | State (B)* | State (A) | Ratio |
|---|---|---|---|
| Air gap | none | .005" | (See data - Table IV) |
| gain | $g_B$ = 100.6 mV/A | $g_A$ = 100.4 mV/A | |
| Noise Sensitivity | $\Psi_B$ = 11.5 mV/N | $\Psi_A$ = 34.6 mV/N, where N is a unit $H_n$ noise. | |

TABLE V-continued

| | State Ⓑ* | State Ⓐ | Ratio |
|---|---|---|---|
| $\beta = \frac{\Psi_A}{\Psi_B}$ | | | .332 |
| $\eta = \frac{\Psi_A g_A}{\Psi_B g_B}$ | | | 3.00** |

*Note that state Ⓑ is assigned to the condition having the least noise sensitivity.
**Note that η is nearly 1/β. This is often a good first approximation. Then η can be adjusted for best noise cancellation at the corrected output $V_c$ as a calibrated magnet is moved to and from the sensor.

Table V says that when the sensors subtraction and divisor means are constructed, the division η is to be set at η=3.00. This should give good correction. We can calculate the expected correction as follows. Use the general Eq. i):

$$V_c = \left(g_B - \frac{g_A}{\eta}\right)I + \left(g_B\Psi_B - \frac{g_A\Psi_A}{\eta}\right)N. \quad \text{Eq. i)}$$

Inserting Table IV values gives:

$$V_c = \left(100.6 - \frac{100.4}{3.00}\right)I + \left((100.6)(11.5) - \frac{(100.4)(34.6)}{3.00}\right)N, \text{ or}$$

$$V_c=(67.1)I+(1156.9-1157.95)N,$$

$$V_c = \left(67.1\frac{\text{mV}}{\text{Amp}}\right)I - \left(1.05\frac{\text{mV}}{N}\right)N.$$

The negative sign shows that the correction is slightly more than needed.

This Hall type sensors useful corrected output is the first term. A 1 Amp input produces 67.1 mV output. The noise N is the second term A unit non-uniform $H_n$ noise N interference should produce 1.05 mV output. Since the corrected gain $g_c$ is:

$$g_c = \frac{67.1 \text{ mV}}{\text{Amp}}\frac{\text{output}}{\text{input}},$$

the noise N component is $$\frac{1.05}{67.1},$$

or 0.0156 equivalent input Amperes.

Also the corrected signal to noise ratio is:

$$SNR_C = \frac{67.1}{1.05} = 63.9 \text{ to one}$$

The benefit obtained can be found from Table V. In state Ⓐ with an air gap, the uncorrected output is:

$$V_A = \left(100.4\frac{\text{mV}}{A}\right)I + \left(34.6\frac{\text{mV}}{N}\right)N$$

This SNR is $$SNR_A = \frac{100.4}{34.6} = 2.90 \text{ to one.}$$

Then the benefit of correction is $$\frac{63.9}{2.90} = 22$$

to one. This is worthwhile.

No air gap has better SNR Proceeding as above:

$$SNR_B = \frac{100.6}{11.5} = 8.75 \text{ to one.}$$

Then the benefit of using correction is $$\frac{63.9}{8.75} = 7.3$$

to one. This also is worthwhile.

It could be increased by slightly increasing η so that the noise term in Eq. i) vanishes.

Specific Method and Mathematical Relationship for Hall Type sensor O.

A specific method of correcting error by selectively modulating the orthogonal field of a Hall type sensor for a LEM model PR-20 is derived from the general method given before, and with reference to Table III which states the results of calibration with a very strong orthogonal field used as the modulated operating parameter. We estimate that a primary effect of the orthogonal field (a field perpendicular to the signal input flux path $\beta_i$ (6) in FIG. 1) is to saturate a section of the core SQ (1) in FIG. 1, thus increasing the reluctance of the core to signal input magnetic field $H_i$ (3).

The data is organized below in Table VI.

TABLE VI

| | State Ⓑ | State Ⓐ | Ratio |
|---|---|---|---|
| Orthogonal field | none | strong | (Data from Table III) |
| gain | $g_B$ = 100 mV/A | $g_A$ = 140 mV/A | |
| noise sensitivity | $\Psi_B$ = 0.13 Amp/N* | $\Psi_A$ = 9.8 Amp/N* | |
| $\beta = \frac{\Psi_B}{\Psi_A}$ | | | .013** |
| $\eta = \frac{\Psi_A g_A}{\Psi_B g_B}$ | | | 106** |

*These are equivalent input currents.
*These values seem extreme. The orthogonal field likely should be reduced.

In table VI the noise sensitivity Ψ is stated as amperes per unit noise N due to an interfering non-uniform $H_n$. Amperes here is the equivalent input signal current Ó which would have the same effect on the sensors output as the noise, as seen in Eq. d), and Eq. e), above. Moreover, since Eq. f) gives $$\Psi \equiv \frac{\delta Ó}{\delta N},$$

we can use Ψ in Table VI as the equivalent input current divided by the interfering unit noise N.

Note that the data of Table III is organized in Table VI with the lower noise sensitivity assigned to state Ⓑ.

$$V_C = \left(g_B - \frac{g_A}{\eta}\right)I + \left(g_B\Psi_B - \frac{g_A\Psi_A}{\eta}\right)N \qquad \text{Eq. i)}$$
$$= \left(100 - \frac{140}{106}\right)I + \left((100)(.13) - \frac{(140)(9.8)}{106}\right)N$$
$$= 98.7I + \left((13)\left(\frac{\text{mV}}{A}\right)\left(\frac{A}{N}\right) - (12.94)\left(\frac{\text{mV}}{A}\right)\left(\frac{A}{N}\right)\right)N$$
$$V_c = \left(98.7\frac{\text{mV}}{A}\right)I + \left(0.06\frac{\text{mV}}{N}\right)N$$

The positive sign indicated that the noise N is slightly under corrected. The noise term would be zero if η=105.54.

The benefit of this error correction by selective modulation can be seen by comparing the signal to noise ratios SNR with and without correction. The SNR in state Ⓑ is obtained from Table VI.

All state Ⓑ

$$\frac{\delta V}{\delta I} = g_B \qquad \left.\frac{\delta V}{\delta N}\right|_B = g_B\Psi_B$$
$$\frac{\delta V}{\delta I} = 100\frac{\text{mV}}{\text{Amp}} \qquad \left.\frac{\delta V}{\delta N}\right|_B = \left(100\frac{\text{mV}}{\text{Amp}}\right)\left(\frac{0.13\ \text{Amp}}{N}\right)$$
$$\left.\frac{\delta V}{\delta N}\right|_B = 13\ \frac{\text{mV}}{N}$$

Eq. i) with values $$\frac{\delta V_c}{\delta I} = g_c \qquad \frac{\delta V_c}{\delta N} = g_c\Psi_c$$
$$\frac{\delta V_c}{\delta I} = 98.7\ \frac{\text{mV}}{A} \qquad \frac{\delta V_c}{\delta N} = .06\ \frac{\text{mV}}{N}$$
$$SNR|_c = \frac{g_c}{g_c\Psi_c}$$
$$= \frac{98.7\ \text{mV}/A}{.06\ \text{mV}/N}$$
$$SNR|_c = 1645\ \frac{\text{mV}/A}{\text{mV}/N}$$

$$SNR_B = \frac{g_B}{g_B\Psi_B}$$
$$= \frac{100\ \text{mV}/A}{13\ \text{mV}/N}$$
$$SNR_B = 7.7\ \frac{\text{mV}/A}{\text{mV}/N}$$

$$\text{Expected Benefit of Correction} = \frac{SNR|_c}{SNR|_B} = \frac{1645}{7.7} = 214 \text{ to one.}$$

Table VI above says that when the sensors correction implementing means are constructed to perform the method shown in Eq. i) above, with η=106 built therein, we can expect that the error corrected output $V_c$ of the sensor will contain notably less noise N than otherwise. We substitute values in Eq. i) to verify this.

Non-contact Ammeter Implementation for Swain Meters

To build a non-contact DC ammeter according to this invention you need at least two things:

1) A clip or clamp sensor which has the essential characteristic of the discovery shown in FIG. 4 between points A & B; namely, the signal gain g remains relatively constant while the response Ó=Z/g to a field $H_n$ changes substantially* (either more or less) and repeatably (it can be calibrated) with some operating parameter (a bias, local saturation, mechanical modulation, or as in FIG. 4, the peak magnetization current $I_{sm}$). It is not required that the teachings of Pat. No. 3,768,011 be used. A Hall detector and a suitable magnetic structure may be used instead. This is shown after the Swain Meter illustration.

* Or vice versa: g changes while O remains constant.

2) Support means, which can be electronic+/or mechanical which implement the method, i.e., the mathematical relation, to produce a sensor output (V) which is a linear function of the input current I to be measured. The sensor performs the correction by making use of the essential characteristic (FIG. 4) or equivalent to cancel the noise (error due to a magnet). This can be implemented by a switching system such as that in FIG. 9 for changing the condition of the operating parameter in a sensor using structures and processes outlined in Pat. No. 3,768,011. However, it is not necessary to switch abruptly from one set of operating conditions to another. An analog (continuously variable) approach may be used to implement Eq. i. Then the gain (g) would change gradually (changing $\eta$) as the $I_{sm}$ change caused a change in the response (Ó) to a magnet ($H_n$), thus changing $\beta$.

A switch means—one of many which will suffice to get good correction of zero offset Z—is shown in FIG. 9.

FIG. 9 starts where the cover drawing (FIG. 2) in U.S. Pat. No. 3,768,011 left off A special inverter is connected in series with the winding on the core of the non-contact sensor. This core may be solid, or split to form a clamp or clip. Capacitor C shunted by resistor $R_s$ are also in series. All are constructed so that the average current $I_s$ flowing in the loop is proportional to the input current $I_i$. Then the average voltage $V_c$ across C and $R_s$ is also proportional to $I_i$. Voltage $V_c$ is the input signal to the corrector.

In FIG. 9 if the capacitor C (16) is large, and also if resistor $R_s$ (17) is large, the time required for $V_c$ to reach a final value in one state can be excessive. This and other reasons led us to build an operational amplifier substitute for $CR_s$. I call this a low input impedance means for converting average current $I_s$ (4) in coupling sense winding $N_s$ (2) to an output voltage $V_c$ because it performs the same functions as $R_sC$, except that it can be a lot faster and it can have voltage gain. Details are not given here. Those familiar with the use of integrated circuit amplifiers will know how to select an operational amplifier with current capability matching the peak coupling sense winding $N_s$ current $I_{sm}$, apply feedback (shunt R & C) from output to negative input, and use the input as the terminals replacing $CR_s$. Also we find the preferred implementation of the method shown in FIG. 11 to be simpler and more effective.

In FIG. 9 the special inverter 15 operating at frequency $f_O$ is series connected with the sensor's coupling sense winding 2 and the parallel combination of capacitor 16 and resistor 17. Input current 7 influences the magnetic material in the core 1, and so also does the magnet 10. So the average current 4 in the loop produces a voltage $V_c$ across capacitor 16 and resistor 17 which is proportional to the input current 7, and also proportional to the effect of noise magnet 10 and its non-uniform field 8. In this implementation, the means driving the operating parameter $I_{sm}$ (12) from 0.2 to 0.4 Amp. is an electronic switch 18.

In state ⓑ, operating parameter 12 is driven by switch 18 to the larger magnitude, marked ④. The polarity switch 19 also goes to the ④ position, which is positive (+) polarity, and also in state Ⓑ the gain switch 20 is in the high gain ④ position.

During the Ⓑ state, the voltage $V_c$ across resistor 17 and capacitor 16 are applied to polarity switch 19 through low pass filter 21 which attenuates potentials, both common and differential mode, above $f_{o/3}$.

The Ⓐ state begins at the end of the Ⓑ state. They are of equal duration in the present analysis and waveform However, duty factor modulation could be used instead of a gain change.

In FIG. 9, state change is governed by the phase shifter 23, counter 24, which goes $Q_n=2^n$ counts before changing the gate, and the gate or switch driver 25. All switches are driven by gate 25. Phase shifter 23 driven by inverter 15 and voltage $v_x$ clocks the counter 24 at about halfway through one half of one cycle of inverter 15. This causes the counter to drive the gate to a new Ⓐ state near the middle of a half cycle when inverter instantaneous current ($i_s$) 4 is near zero, not at a start or finish of a half cycle of the inverter where the inverter current ($i_s$) 4 is at a maximum.

In the Ⓐ state, operating parameter $I_{sm}$ 12 is reduced from 4 to 2, the polarity switch 19 goes to (−) or negative, and the gain is reduced by switch 20. The Ⓐ state is marked as the ② position on all switches.

In both the Ⓐ and Ⓑ states, the gain control 20 drives the voltage $V_c$ through to the integrator 22, which averages the signals from both states over a number of gate cycles to get the error corrected signal to the input of amplifier 26. The output of amplifier 26 is error corrected, and applied to meter 27 (analog+/or digital) and to the output terminals 28 where the corrected output is $V_o$.

In FIG. 9 the noise due to magnet 10 and interfering field ($H_n$) 8 is canceled by the process of during Ⓑ, add positive full signal and the small noise $Z_4$ and then during Ⓐ, subtracting half of the twice as large $Z_2$ and half of the signal. The noise cancels, but half of the signal remains in the corrected output.

FIG. 10 shows some of the voltages and currents in FIG. 9 as they change with time.

In FIG. 9 a counter 24 and switches 18, 19,and 20 are provided to implement the mathematical relation Eq. i), making use of the discovered essential characteristics of the clamp as shown in FIG. 4. The switches are all operated by the gate signal 25. This times the process. A phase shifter 23 and counter 24 are driven by the inverter 15 at frequency $f_o$. The counter drives the gate differently after $Q_n=2^n$ cycles of $f_o$, where n may be as sa as 1, but 5 or 6 is more typical.

In this illustrative example, the timing of the transfer from “2” to “4” state and back is controlled by the phase shifter (Ø) 23 and a counter 24. The gate switching is synchronized to the inverter $V_x$, and delayed by the phase shifter an amount roughly equal to half of a half cycle of $V_x$. This avoids transients just when current $I_s$ is at a maximum The counter is set to $2^n$ ($V_x$ cycles), where this time is long compared to the time constant $CR_s$ 16 and 17.

The gate is in the “low” or “2” state as a cycle begins in time interval Ⓐ in FIG. 10. This sets up operation at point A on FIG. 4 where the sensitivity to a non-uniform magnetic field $H_n$ is greatest, but the gain (g) is about the same as at point B. At point A, and during time interval Ⓐ;

The gate is low, so the $I_{sm}$ switch sets $I_{sm}$ at about 0.2 A peak.

The polarity switch sets the gain to negative, so a positive $I_i$ produces a negative input to the integrator.

The gain switch sets the magnitude of the gain to $g_2$, which is about half, so the integrator sees a signal only half as strong as usual.

After a time interval Ⓐ which is long* compared to the time constant of $CR_s$ 16 and 17, this "2" gate state ends and an equal time interval Ⓑ ** starts during which the gate is "high, and is in 4" and causes switches to:

Increase $I_{sm}$ to a much greater value, generally 0.4 to 0.7 A peak.

The polarity switch is set positive so that a positive $I_i$ sends a positive voltage to the integrator.

The gain switch sets the magnitude of the gain (g) to the usual unity value; generally about double that in the "2" state during time interval Ⓐ.

** If the duty factor is other than 50:50, the effective ratio of gains $g_4$ and $g_2$ will change, and η will also change.

The "2" and "4" states in time intervals Ⓐ and Ⓑ alternate, and the integrator 22 averages the output packets of both to give one long term average* output. This is amplified 26 to produce the output $V_o$ 28 for data logging, etc., and driving the output meter 27.* The user can read the input current $I_i$ 7 and not be troubled by the noise of zero shift error Z due to magnet 10** because it has been largely removed by the above error correction.

* Sample and hold technology can be beneficial in both FIG. 9 and FIG. 11. We usually keep it simple and just average the signals.

*** When used in other measurement and control apparatus, the output will be amplified and buffered so as to be ready to operate a relay, actuator, valve, analog meter, or digital display and meter.

Construction and Results

Several preliminary forms of this invention have been bulk and tested with mixed results. The best so far uses the implementation shown in FIG. 11 and a 5" diameter aperture clip #88, constructed using structures and processes outlined in U.S. Pat. No. 3,768,011 and in the same general form (see FIG. 1) as clips sold today. The steel core* 1 has 5 layers of 0.725" wide, 4 mil thick type D steel tape from Magnetics, Inc. in Butler, Pa. The clip's coupling sense coil 2 has about 1000 turns of #22 magnet wire with a resistance of 3 or 4 ohms. At point A on FIG. 4 the peak magnetization current 12 is about 0.2 A, and at point B it is about 0.4 A The ratio of the zero offset error responses (β in Eq. 5) is about 0.5.

* A low reluctance ferrite or low reluctance steel laminations may be used for the core 1. So fir we have gotten better results with the 4D steel tape.

FIG. 4 plots the equivalent input current of the zero offset Z due to a standard magnet as a function of $I_{sm}$, the peak current in the coupling sense winding $N_s$. This 0.2 to 0.4 Amp. peak current is flowing in $N_s \cong 1000$ turns on a 5" diameter core, SQ. What really counts is the peak magnetic field intensity $H_{sm}$ acting on the steel of the core. Since $$H_{sm} = \frac{N_s I_{sm}}{1},$$

where 1 is the mean flux path length, we can reduce $I_{sm}$ if we increase $N_s$, or reduce 1, etc.

Capacitor 16 is 470 μF, as is capacitor 162. Resistor 17 is 200 ohms, but resistor 172 is 100 ohms. The counter $Q_n$ is set for $2^5$, where n=5. The integrator 22 has a cutoff frequency of about 1 Hz.

The implementation SN 2336, outlined in FIG. 11, runs on 12 volts with $f_o$ roughly equal to 400 Hz and satisfies the requirements of the mathematical relation shown in Eq. i) with a gain ratio η=2. Eq. i) is the general method, given in the general method section.

When tested with a non-uniform magnetic field $H_n$ from a nearby speaker magnet, the zero offset error was one ampere equivalent input under the previous conditions not using this invention. The noise or zero offset error in the corrected output was generally less than ±0.1 Amp. equivalent input current. This is a ten to one benefit The benefit is usually 3 to 20. Positioning the magnet nearer the side of the clip gave better results than when the magnet was nearer the lips of the clip because side magnetic measurements were used in setting values in Eq. j). If desired, error correction can be optimized for noise near the lips by adjusting η and $$\frac{g_A}{g_B}$$

there.

The usual zero offset error rating for Swain Meter 5" clips is less than ±40 ma. equivalent input currents due to the uniform ($H_u$) field of the earth ($H_e$).

The correction is practically perfect (less than 40 ma offset) for magnet $H_n$ positions generally beside the coil, but when $H_n$ is across the lips the zero offset error increases to 0.1 to 0.2 A equivalent input current. This is not perfect, but still at least 5 times better than without correction.

A Simpler Implementation

The simpler sensor with support means in FIG. 11 satisfies the requirements of the mathematical relation and generally performs the functions shown in FIG. 9. However, the detailed layout is simplified by, in effect, combining functions. The LPF, polarity reversing switch and gain switch are combined by using two ($CR_s$) pairs—one 16 and 17 for "2" and another 162 and 172 for "4". A switch selects first ($C_2R_{s2}$) 16 and 17 for connection in series with ($N_s$) 2 for a time of $2^4$ cycles* of the inverter at $f_o$=400 Hz Capacitor ($C_2$) 16 charges up on ($I_{s2}$) 4 at point A in FIG. 4. This provides output packet A. Then the counter flips the gate 25 so that operation switches to point B on FIG. 4, so ($C_4R_{s4}$) 162 and 172 are connected in series with $N_s$ and ($I_{s4}$) 42 charges ($C_4$) 162 to provide output packet B.

* $2^n$ cycles, where n=1 is possible, but n=4 or 5 is typical.

Integration occurs in ($C_2$, $C_4$*) 16 and 162, and also in the low pass filer action of the output amplifier 26. The inputs to this gain of 20 V/V amplifier are connected differentially to ($C_2$) 16 and ($C_4$) 162. The gain ratio η is set by making $R_{s2}$=half of $R_{s4}$.

* Sampled data technology can improve FIG. 11.

Hall Devices

Introduction

We have seen clamp-on DC ammeters which incorporate Hall devices. In a Hall device, the output voltage is the product of a bias current and a flux density-all 3 being orthogonal in a silicon crystal We have observed that Hall type instruments made by F. W. Bell of Orlando, Fla., and by LEM HEME of England and Milwaukee, Wisconsin have zero offset which changes as the clip moves in the uniform field $H_u$ of the earth. We have also measured the LEM model PR-20 near a magnet and have found that it's zero offset is changed by a non-uniform magnetic field $H_n$.

It is desired to correct Hall devices for zero offset error due to:

a) Non-uniform field of nearby magnet ($H_n$).

b) Uniform field ($H_u$), like that of the earth ($H_e$).

First Calibration

For a first calibration, very strong Orthogonal magnets modulated the gain. In the experiment, the modulated parameter was the strength of a magnetic field orthogonal to the signal field. This saturated the signal path and so modulated the reluctance of the core carrying signal flux to the hall devices The results appear below.

TABLE III

| | No magnet present | Órthogonal magnet present | Ratio of gain or error |
|---|---|---|---|
| a)Gain (g) for input current $I_i$: | $\frac{100\ \text{mV}}{\text{A}}$ | 130 or 150 mV/A | 0.77 |
| b)Earth field ($H_e$) error: | 43 ma.* ↑ | ↖1.58* A. | 0.027 |
| c) $H_n$ error due to "GE" radio speaker (as used with our ¾"& 5" clip tests) | (*these are equivalent input currents, Ó) | | |
| | $\frac{130^*\ \text{ma.}}{\text{"GE"}}$ | $\frac{9.8^*\ \text{Amp}}{\text{"GE"}}$ | 0.013 |

(Results of application are in preceeding Table VI.)

This is the discovery ($D_H$). It is analogous to that for the Swain Meter® as shown in FIG. 4, both for the uniform $H_u$ field of the earth, $H_e$, and also for the non-uniform field $H_n$ of a nearby magnet. These conditions appear repeatable and reliable, although more tests will be required to assure linearity, etc. We will probably want to reduce the strength of the orthogonal magnet so that the ratio of error is closer to 0.2 to 0.5 for $H_e$ and "GE". Then we expect to be able to calibrate gains and error responses (sensitivities) and build a corrector for offset errors due to magnets.

The mathematical relationship (MR) will be in the same form as that for the Swain Meter, i.e., Eq. i) applies to both. Two application examples are given at Table V and VI.

Reluctance Modulator

Órthogonal magnet here is a general term Real magnets and core material may move, or more likely, an AC field will be used to modulate the permeability or magnetic reluctance of the signal's magnetic path or feedback core. For example, FIG. 12 shows a structure adapted to this use.

Second Calibration

We further calibrated the LEM model PR-20. The modulated parameter was the air gap of the core. This changed the reluctance of the core for signal full. The added reluctance of the overall core, especially near the nose where the several layers of thin plastic bubble were placed, provided selective modulation. The gap was probably 2 to 5 thousandths of an inch. The results are given in Table IV.

TABLE IV

| | No gap | With gap | Ratio of gain or error |
|---|---|---|---|
| Gain (g) for input current $I_i$ | $\frac{100.55\ \text{mV}_0}{\text{Amp. in}}$ | $\frac{100.35\ \text{mV}_0}{\text{Amp. in}}$ | 0.998 |
| Earth Field ($H_e$) error | $\frac{3.8\ \text{mV}_0}{\text{Earth circle}}$ | $\frac{5.7\ \text{mV}_0}{\text{Earth circle}}$ | 0.67 |
| "GE" Magnet ($H_n$) error | $\frac{11.5\ \text{mV}_0}{\text{"GE"}}$ | $\frac{34.6\ \text{mV}_0}{\text{"GE"}}$ | 0.33 |

(Results of application are in Table V)

This selective modulation is less extreme than that of the orthogonal magnets, and it also has a good essential characteristic—the gain (g) is stable and the error responses (sensitivities) due to $H_e$ and $H_n$ change a lot as the reluctance of the core is changed by the air gap. Then we are confident that zero offset error will be corrected by a scheme derived from Eq. i). Again, it is expected that it will be more feasible to selectively modulate the core path reluctance using the scheme shown above in FIG. 12.

The version of the general method shown in Eq. i) is applied to the data shown above in Table IV. This is done in the specific method—Hall G section, and the results are given in Table V on page 49.

CONCLUSION

The particular form of the general method shown as Eq. i) can be widely applied to considerably improve the accuracy of sensors and implements for measuring and/or controlling physical quantities. Out experience to date is primarily with canceling interfering noise from magnetic fields acting on non-contact DC ammeters. We expect to learn of applications in diverse fields such as fluid flow, chemical concentration and position measurement and control where interfering noise is a problem.

I claim:

1. A method for making an implement with improved accuracy for measurement or control of a physical quantity by canceling out error due to an interfering noise N so as to provide an error corrected output $V_c$, sensitive to a signal input I; which includes the steps:

find or construct a sensor with an output V which has a signal to noise ratio SNR which changes substantially when the condition of an operating parameter Q is selectively modulated, provide means whereby said output V of the said sensor in a higher said SNR state due to a condition of said operating parameter Q is combined with said output V of said sensor in a lower said SNR state due to a different said condition of said operating parameter Q, and adjust said combined so that the said noise N mostly cancels but said sensor continues to have a good gain for said signal input I.

2. A method as claimed in claim 1, wherein said input I and said noise N are conditioned, or generally change by only a small amount during the time duration of one full operating cycle of change of said condition of said operating parameter Q.

3. A method as claimed in claim 1, wherein said sensor comprises at least two said sensors or a composite sensor having at least two sectors, and wherein each one of said two sensors or said two sectors operates full time at a different said condition of said operating parameter Q, so that there is thereby no need to have a short operating cycle time and no need to condition said input I and said noise N or require that they be generally constant over said one full operating cycle.

4. A method as claimed in claim 1 wherein said sensor is a non-contact ammeter which incorporates at least one Hall device associated with a magnetic core SQ.

5. A method as claimed in claim 1 wherein said sensor is a non-contact ammeter which incorporates at least one Hall device associated with a magnetic core SQ, and wherein said operating parameter Q is the magnetic reluctance of said magnetic core SQ.

6. A method as claimed in claim 1 wherein said sensor is a non-contact ammeter which incorporates a Swain type coupling winding $N_s$ wound on a core SQ.

7. A method as claimed in claim 1 wherein said sensor is a non-contact ammeter which incorporates a Swain type sense coupling winding $N_s$ on a core SQ, and wherein said operating parameter Q is the peak current $I_{sm}$ in said sense coupling winding $N_s$.

8. A process for constructing an improved machine having a machine output $V_c$ for at least one of measuring or controlling a physical quantity I by canceling out an error in said machine output $V_c$ due to an interfering noise N so as to provide an error corrected machine output $V_c$ which is sensitive to said physical quantity I, which includes at least the steps: find/construct, and provide; described as follows:

at least one of find or construct a sensor with an output V which has a signal to noise ratio SNR which changes substantially when the condition of an Operating Parameter is selectively modulated; and provide means whereby said sensor output V in a higher said SNR state due to a condition of said Operating Parameter Q is combined with said sensor output V in a lower said SNR state due to a different said condition of said Operating Parameter Q; and adjust at least one of said combined, said Operating Parameter Q or said sensor so that the said error due to said noise N mostly cancels at the said machine output $V_c$, but said machine output $V_c$ is well responsive to said physical quantity I.

9. A process as claimed in claim 8, wherein said physical quantity I and said noise N during the time duration of one full operating cycle of change of said condition of said operating parameter Q are at least one of: changed by only a small amount naturally, or are so conditioned.

10. A process as claimed in claim 8, wherein said sensor comprises at least one of: at least two said sensors or a composite sensor having at least two sectors, and wherein each one of said two sensors or said two sectors operates full time at a different said condition of said operating parameter Q, so that there is thereby no need to have a short operating cycle time and no need to condition said physical quantity I and said noise N or require that they be generally constant over said one fill operating cycle.

11. A process as claimed in claim 8 wherein said sensor is a non-contact ammeter which incorporates at least one Hall device associated with a magnetic core SQ.

12. A process as claimed in claim 8 wherein said sensor is a non-contact ammeter which incorporates at least one Hall device associated with a magnetic core SQ, and wherein said operating parameter Q is the magnetic reluctance of said magnetic core SQ.

13. A process as claimed in claim 8 wherein said sensor is a non-contact ammeter which incorporates a Swain type sense coupling winding $N_s$ wound on a core SQ.

14. A process as claimed in claim 8 wherein said sensor is a non-contact ammeter which incorporates a Swain type sense coupling winding $N_s$ on a core SQ, and wherein said operating parameter Q is at least one of the peak current $I_{sm}$ or the number of turns in said sense coupling winding $N_s$.

15. A method for making a more accurate implement for at least one of measurement or control including the steps:

Construct a port for desired input signal I, which of necessity makes a port for undesired error producing interference N, construct a port for said implement's output $V_c$, acquire an Essential Characteristic type sensor having an output V responsive to said desired input signal I, and also responsive to said undesired error producing interference N, and further having an operating parameter of magnitude Q;

show that said Essential Characteristic type sensor has a useful said Essential Characteristic evidenced by a signal to noise ratio SNR of said sensor observed to change a lot when the said magnitude Q of said operating parameter is modulated over a practical range;

provide said implement equipped to:

support said sensor and largely cancel said interference N but retain a good signal I at said output $V_c$ by suitably modulating said magnitude Q, operating on said sensor output V and coupling the result to said output $V_c$ of said implement in a manner such that a reduced from of the said sensor output V in a lower said SNR state is combined with said sensor output V in a higher said SNR state so that said interference N largely cancels.

16. A method for making a more accurate sensor with implement for at least one of measurement or control, made in steps:

obtain a said sensor having an output V responsive to a physical quantity input I, the gain g given by $$g \equiv \frac{\delta V}{\delta I},$$

and said output V is also responsive to an undesired error producing interference N, the sensitivity Ψ being $$\Psi \equiv \frac{\delta V}{\delta N},$$

and in addition, said sensor has an operating parameter of magnitude Q which modulates said Ψ, and to a lesser extent said gain g;

at least one of calibrate, or make by a proven process, or otherwise assure that said sensor has a strong Essential Characteristic evidenced by observing that said Sensitivity Ψ changes a lot more than said gain g when said magnitude Q is driven over a practical range of values;

provide an error correction form of said implement having an output $V_c$, and also fitted to support said sensor, and further equipped with state means driving said magnitude Q, dividing the said output V, and combining the said output V, and wherein said combining is coupled to said implement output $V_c$;

construct the said state means so that there is at least one state "A" wherein said means drive said magnitude Q to produce a small said sensitivity Ψ with good said gain g, and also said sensor output V is largely said divided and made available for said combining;

further construct said state means so that there is also at least one state "β" wherein said means drive said magnitude Q to produce a small said sensitivity Ψ with good said gain g, and also said sensor output V is but slightly said divided and made available for said combining;

to get said error correction, at least one of:

set by a proven process, or adjust at least one of a said means dividing or said means combining so that the said largely divided said large Ψ of said state "A" is about equal to and opposite from the said but slightly divided said small Ψ of said state "β", and thereby the said Ψ's approximately cancel in said combiner so that the said error producing interference N is mostly removed from said output $V_c$; and not withstanding there is remaining at said $V_c$ a large part of said responsiveness to said physical quantity input I;

so that thereby said sensor with implement is a whole lot more accurate than comparable transducers for said physical quantity input I in the presence of said interference N.

* * * * *